(12) United States Patent
Cummings et al.

(10) Patent No.: US 10,153,409 B2
(45) Date of Patent: Dec. 11, 2018

(54) VACUUM LAMINATION METHOD FOR FORMING A CONFORMALLY COATED ARTICLE AND ASSOCIATED CONFORMALLY COATED ARTICLES FORMED THEREFROM

(71) Applicant: Dow Silicones Corporation, Midland, MI (US)

(72) Inventors: Michelle R. Cummings, Midland, MI (US); Fumito Nishida, Midland, MI (US); Nick E. Shephard, Midland, MI (US)

(73) Assignee: Dow Silicones Corporation, Midland, MI (US)

( * ) Notice: Subject to any disclaimer, the term of this patent is extended or adjusted under 35 U.S.C. 154(b) by 0 days.

(21) Appl. No.: 15/516,772

(22) PCT Filed: Oct. 21, 2015

(86) PCT No.: PCT/US2015/056682
§ 371 (c)(1),
(2) Date: Apr. 4, 2017

(87) PCT Pub. No.: WO2016/065016
PCT Pub. Date: Apr. 28, 2016

(65) Prior Publication Data
US 2017/0309799 A1    Oct. 26, 2017

Related U.S. Application Data

(60) Provisional application No. 62/068,312, filed on Oct. 24, 2014.

(51) Int. Cl.
*H01L 33/54* (2010.01)
*H01L 33/50* (2010.01)
(Continued)

(52) U.S. Cl.
CPC .......... *H01L 33/54* (2013.01); *B32B 37/1018* (2013.01); *H01L 24/93* (2013.01);
(Continued)

(58) Field of Classification Search
None
See application file for complete search history.

(56) References Cited

U.S. PATENT DOCUMENTS

| | | | |
|---|---|---|---|
| 7,528,077 B2 | 5/2009 | Izuno et al. | |
| 7,932,108 B2 | 4/2011 | Yamada et al. | |

(Continued)

FOREIGN PATENT DOCUMENTS

| | | |
|---|---|---|
| CN | 203339218 U | 12/2013 |
| JP | 4915869 | 11/2012 |
| WO | WO2012023119 | 2/2012 |

OTHER PUBLICATIONS

JP4915869 Machine translation.
CN203339218U Machine translation.

*Primary Examiner* — Asok K Sarkar
(74) *Attorney, Agent, or Firm* — Warner Norcross & Judd LLP

(57) ABSTRACT

Vacuum lamination methods for forming conformally coated articles having a preformed lamination layer conformally coated to or on an object such as an LED array are provided. These vacuum lamination methods utilize a single heating step to heat a middle portion of the preformed lamination layer to a flowable condition prior to the preformed lamination layer being conformally coated over the article, such as the array of light emitting diodes disposed on an inner portion of a first side of a submount wafer.

20 Claims, 8 Drawing Sheets

(51) Int. Cl.
    *H01L 23/00*     (2006.01)
    *B32B 37/10*     (2006.01)
    *H01L 25/075*     (2006.01)
    *B32B 37/00*     (2006.01)
    *H01L 33/44*     (2010.01)

(52) U.S. Cl.
    CPC ........ *H01L 25/0753* (2013.01); *H01L 33/502* (2013.01); *H01L 33/507* (2013.01); *B32B 37/003* (2013.01); *B32B 2309/02* (2013.01); *B32B 2309/04* (2013.01); *B32B 2309/12* (2013.01); *B32B 2457/00* (2013.01); *B32B 2457/14* (2013.01); *B32B 2457/20* (2013.01); *H01L 33/44* (2013.01); *H01L 33/501* (2013.01); *H01L 2933/005* (2013.01); *H01L 2933/0025* (2013.01); *H01L 2933/0041* (2013.01)

(56) References Cited

U.S. PATENT DOCUMENTS

| | | | |
|---|---|---|---|
| 2010/0148127 A1 | 6/2010 | Ellinger et al. | |
| 2013/0133836 A1* | 5/2013 | Yasumoto | B32B 39/00 156/382 |
| 2016/0126429 A1* | 5/2016 | Mahowald | H01L 33/505 257/98 |

* cited by examiner

VACUUM LAMINATION METHOD FOR FORMING A CONFORMALLY COATED ARTICLE AND ASSOCIATED CONFORMALLY COATED ARTICLES FORMED THEREFROM

CROSS REFERENCE TO RELATED APPLICATIONS

This application is a U.S. national stage filing under 35 U.S.C. § 371 of PCT Application No. PCT/US15/056682 filed on 21 Oct. 2015, currently pending, which claims the benefit of U.S. Provisional Patent Application No. 62/068,312 filed 24 Oct. 2014 under 35 U.S.C. § 119 (e). PCT Application No. PCT/US15/056682 and U.S. Provisional Patent Application No. 62/068,312 are hereby incorporated by reference.

FIELD OF THE INVENTION

This invention generally provides a method for forming a conformally coated article, and the conformally coated article formed therefrom. More specifically, the method comprises a vacuum lamination method.

BACKGROUND OF THE INVENTION

A variety of coated articles can be fabricated by vacuum lamination for a variety of applications such as electronics, building, vehicle, healthcare, and consumer applications. For illustration, some electronics applications use coated electronic devices such as coated light emitting diodes. Light emitting diode (LED) devices including an array of light emitting diodes (LEDs) coupled to a substrate can be fabricated to generate light in different colors. One way for producing light of different colors or for otherwise controlling or manipulating the light generated from the LEDs is to deposit a phosphor material over the array of LEDs. There are many ways to do this. One of the most common ways is to dispense a mixture of phosphor and encapsulant over the LEDs. Another way is to mix phosphor particles in an uncured thermosetting binder material to form a preformed lamination layer, and then laminate this layer over the array of LEDs to form a conformal coating thereon. The lamination method commonly used is a vacuum lamination technique that includes two distinct heating steps, hereinafter referred to as a two-step vacuum lamination technique or method.

In this two-step vacuum lamination technique, the preformed lamination layer is first heated to temperatures high enough to achieve flow in the uncured thermosetting binder material, followed by a second heating step wherein the preformed lamination layer is reheated and conformally coated to the LED array. In this first heating step, the preformed laminated layer begins to cure (i.e., crosslink), therein reducing the flow characteristics of the layer, and hence the layer may be too stiff to be subsequently conformed during the second final heating step or, alternatively may be conformed but with substantial defects associated therewith. Still further, even wherein the curing conditions during these two-step vacuum lamination techniques are precisely controlled, the processing time encompassing the second heating step and subsequent conforming of the preformed lamination layer over the array of LEDs is limited due to the partial curing of the binder material in the first heating step. Also, the limited processing time during the second heating step and subsequent conformation step does not allow the two-step vacuum lamination technique to be used on arrays of LEDs of varying heights, and also limits the choices for binder materials and phosphor materials that may be used in two-step vacuum lamination techniques based upon this limited processing time.

Manufacturing other coated articles for a variety of applications such as other electronics applications, building, vehicle, healthcare, and consumer applications have many of the aforementioned lamination problems.

The present invention addresses many of the problems with lamination techniques utilizing two-step vacuum lamination technique described above.

BRIEF SUMMARY OF THE INVENTION

The present invention discloses vacuum lamination methods for forming conformally coated articles by vacuum lamination for a variety of applications such as consumer, healthcare, building, vehicle, and electronics applications such as light emitting diode (LED) devices.

In one embodiment, which is not restricted to LED arrays or to objects having sides, this invention is a method of fabricating a conformally coated article from an assembly that is housed in a vacuum chamber of a fabrication device; Wherein the vacuum chamber contains an applied vacuum; Wherein the assembly comprises a preformed lamination layer and an object having a surface in need of lamination; Wherein the preformed lamination layer has a first surface and a second surface opposite the first surface, and a heat-softened middle portion at a first temperature and surrounded by an edge portion; Wherein the object has a first surface and a second surface opposite the first surface, and the first surface being in need of lamination and comprising an inner portion and a perimeter portion surrounding the inner portion; Wherein the assembly is configured such that the first surface of the preformed lamination layer is positioned facing the first surface of the object, wherein the edge portion of the preformed lamination layer forms a gastight seal to the perimeter portion of the first surface of the object such that the assembly contains a gastight inner region defined by a combination of the gastight seal, the first surface of the preformed lamination layer and the first surface of the object, wherein the heat-softened middle portion of the preformed lamination layer is spaced apart from the inner portion of the first surface of the object by the gastight inner region, and wherein the gastight inner region contains a reduced gas pressure; Wherein the applied vacuum in the vacuum chamber is effectively equal to the reduced gas pressure in the gastight inner region of the assembly; and Wherein the method comprises: Conforming the heat-softened middle portion of the preformed lamination layer to the inner portion of the first surface of the object by increasing gas pressure within the vacuum chamber such that the gas pressure within the vacuum chamber is greater than the reduced gas pressure within the gastight inner region, thereby conformally pushing the heat-softened middle portion against the inner portion of the first surface of the object so as to fabricate the conformally coated article; Wherein the conformally coated article comprises a conformed lamination layer and the object, wherein the conformed lamination layer is formed from the preformed lamination layer and has a first surface and a second surface opposite the first surface, and a middle portion and an edge portion surrounding the middle portion; wherein the object has a first surface having an inner portion and a perimeter portion surrounding the inner portion, wherein the inner portion of the first surface of the object is conformally coated by the middle portion of the conformed lamination layer; and wherein the edge portion of the conformed lamination layer forms a gastight seal to the perimeter portion of the first surface of the object.

For illustration, LED devices having a plurality of light emitting diodes (LEDs) and a preformed lamination layer conformally coated to an LED array in which a single heating step is utilized to heat the middle portion of the preformed lamination layer prior to the preformed lamination layer being conformally coated over the array of LEDs disposed on a first side of a substrate, e.g., a submount wafer. In another embodiment, wherein the conformally coated article comprises a conformally coated LED array, the object is a substrate for LEDs, and the object's first surface is a first side of the substrate, e.g., a submount wafer, the method includes: (A) mounting a preformed lamination layer having a first surface and a second surface over an LED array; (B) adhering a portion of the edge portion of the preformed lamination layer to the perimeter portion of the first side of the substrate, e.g., a submount wafer; (C) introducing the LED array and the preformed lamination layer to the vacuum chamber; (D) after step (C), applying a vacuum within the vacuum chamber and heating the preformed lamination layer to a first temperature sufficient to soften the edge portion and the middle portion of the preformed lamination layer; (E) sealing the softened edge portion to the perimeter portion under the applied vacuum to create an gastight seal there between, thereby creating an gastight inner region defined by the gastight seal, the first surface of the preformed lamination layer and the first side of the substrate, e.g., a submount wafer; and (F) after step (E), conforming the softened preformed lamination layer over the LED array by increasing the gas pressure within the vacuum chamber in an area not defined by the gastight inner region to a pressure greater than the gas pressure within the gastight inner region.

In another embodiment, the method includes: (A) mounting a preformed lamination layer having a first surface and a second surface over an LED array; (B) introducing the LED array and the preformed lamination layer to the vacuum chamber; (C) after step (B), applying a vacuum within the vacuum chamber; (D) sealing the edge portion to the perimeter portion under the applied vacuum to create an gastight seal there between, thereby creating an gastight inner region defined by the gastight seal, the first surface of the preformed lamination layer and the first side of the substrate, e.g., a submount wafer; (E) after step (D), heating the preformed lamination layer to a first temperature sufficient to soften the middle portion of the preformed lamination layer; and (F) conforming the softened preformed lamination layer over the LED array by increasing the gas pressure within the vacuum chamber in an area not defined by the gastight inner region to a pressure greater than the gas pressure within the gastight inner region.

The vacuum lamination methods of the present invention forms generally defect free conformal coatings on the LED arrays in a simple and repeatable manner.

In addition, by limiting the heating of the middle portion of the preformed lamination layer to a single heating step prior to the layer being conformally coated over the LEDs, the processing window for applying and conforming the lamination layer is increased as compared to two-step vacuum lamination techniques in the prior art in which two distinct heating steps are utilized. This in turn allows the use of preformed lamination layers having different phosphor levels, in combination with additional or differing binder compositions having varying rheologies or cure speeds, to be formed in the same fabrication device that cannot be utilized in two-step vacuum lamination techniques due to the limited processing window. Still further, the method of the present invention allows for the conformal coating over arrays of LEDs having varying heights due to this increased processing window which is not available in two-step vacuum lamination techniques.

BRIEF DESCRIPTION OF THE DRAWINGS

Other advantages and aspects of this invention may be described in the following detailed description when considered in connection with the accompanying drawings wherein.

DETAILED DESCRIPTION OF THE INVENTION

Figure 1:
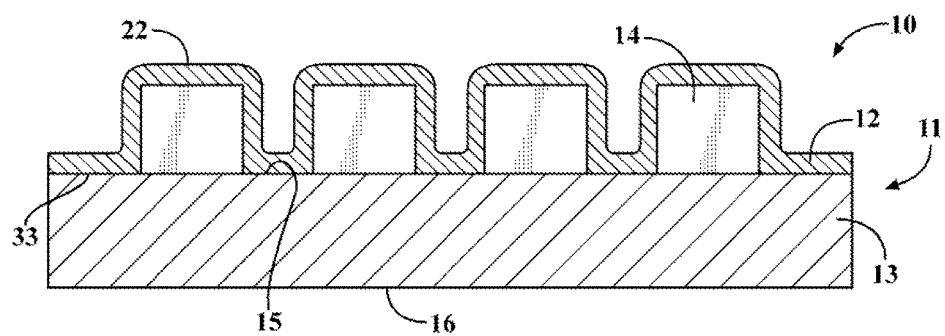
FIG. 1 is a cross-sectional view of an LED device having a preformed lamination layer conformally coated over an LED array in accordance with the present invention.

The Abstract and the Summary are incorporated here by reference. The heat-softened middle portion of the preformed lamination layer is obtained by heating the middle portion of the preformed lamination layer to the first temperature in a single heating step prior to the preformed lamination layer being conformally coated over the object such as the LEDs.

The preformed lamination layer may be composed of any material that can sequentially be heat-softened, sealed under vacuum to a surface of an object to form a gastight inner region, and conformed to the surface of the object. In some embodiments the preformed lamination layer is composed of a thermoplastic or thermosetting material. Such material may be an organic polymer or a silicone. The organic polymer may be a thermoplastic or thermosetting macromolecular material such as a polyolefin, an ethyl vinyl acetate (EVA), an epoxy, a polyacrylate, or a poly(vinyl butyral). The silicone may be a thermoplastic or thermosetting macromolecular material such as a hot melt silicone or a resin-linear silicone. The silicone may be curable such as by condensation, hydrosilylation, or free radical curing. In some embodiments the material of the preformed lamination layer is a hydrosilylation curable silicone, alternatively condensation curable, alternatively free radical curable. In some embodiments the material of the preformed lamination layer is composed of a thermoplastic material. In other embodiments the material of the preformed lamination layer is composed of a thermosetting material. For use in any given application, optionally the material of the preformed lamination layer may also be chosen based on it having one or more additional properties suitable for such an application. Examples of such additional properties are adhesion, optical transmittance, modulus, hardness, compatibility with an optional constituent such as a finely divided filler or phosphor, resistance to yellowing or oxidizing, and resistance to degradation caused by prolonged exposure to heat and/or light.

The term "reduced gas pressure" means a force exerted by a gaseous or vaporous substance in a volumetric space or region that is housed within a vacuum chamber, wherein the force is less than ambient gas pressure (i.e., the force that existed prior to the applying a vacuum step). The means of lowering the force comprises applying a vacuum, i.e., placing the vacuum chamber and volumetric space in fluidic communication with a vacuum source, such as an operating vacuum pump. The vacuum chamber has a controllable pressure region which is in fluidic communication with the vacuum source or with a source of gas that is external to the vacuum chamber. The source of gas may be air atmosphere; an inert gas source such as a source of gaseous nitrogen, helium or argon; or, if desired, a treatment gas such as gaseous hydrogen, oxygen, monosilane, or the like. The phrase "the applied vacuum in the vacuum chamber is effectively equal to the reduced gas pressure in the gastight inner region of the assembly" means that in some embodiments the applied vacuum is equal to the reduced gas pressure and in other embodiments that the reduced gas pressure in the gastight inner region of the assembly is slightly different (e.g., ±0.1 kilopascals) than the applied vacuum in the vacuum chamber, but not so much higher as to cause the preformed lamination layer to bulge or puff and result in process failure and not so much lower as to cause the preformed lamination layer to contact the inner portion of the first surface of the object to be conformally coated.

This invention has been described herein in an illustrative manner by disclosing a plurality of representative, non-limiting inventive embodiments, aspects, and examples thereof. Taken together they enable a person of ordinary skill in the art to understand how to make and use the invention without undue experimentation. Any reference to "this invention" or an equivalent expression (e.g., the present invention or the invention) shall mean those representative inventive embodiments, aspects, and examples, and cannot be used to unduly limit that inventive scope. The terms aspect and embodiment are used interchangeably. Any inventive example referenced herein may be relied upon and provides adequate support for specific inventive embodiments. Any reference to a Markush group may be equivalently expressed in different ways. E.g., a Markush group of members A, B, and C may be equivalently expressed as: "a member selected from A, B, and C"; "a member selected from the group consisting of A, B, and C"; or "a member A, B, or C". The Markush group may comprise two or more of a genus, a subgenus thereof, and one or more specific members thereof; each of which may be relied upon individually or collectively and provides adequate support for specific inventive embodiments. All U.S. patent application publications and U.S. patents referenced herein, or a portion thereof if only the portion is referenced, are hereby incorporated herein by reference to the extent that incorporated subject matter does not conflict with the present description, which would control in any such conflict.

The description of this invention may be by way of explicit statements and contextual indications (unambiguous) and may make use of any one or more of the following general words, terms and expressions. Any use of alternatively shall indicate an independent embodiment. The articles "a", "an", and "the" each refer to one or more. Any reference to "comparative," as in comparative example, is for illustration purposes only and shall not mean something from the prior art. Any reference to "contacting" means bringing into physical contact. Any reference to "greater than", as in greater than a specified individual number (e.g., >50 or ≥50), encompasses a range or subrange that includes as its upper endpoint the absolute maximum (e.g., 100%) or, as the case may be where there is no absolute maximum, a practical maximum (e.g., <10,000 repeat units or 10,000,000 g/mol. Alternatively, the upper endpoint may be less than the absolute maximum (e.g., <100%) or less than the practical maximum (e.g., <10,000 repeat units or <10,000,000 g/mol). Any reference to "less than", as in less than a specified individual number (e.g., <10 or ≤10), encompasses a range or subrange that includes as its lower endpoint the absolute minimum (e.g., zero (0)) or, as the case may be where there is no absolute minimum, a practical minimum (e.g., greater than zero (>0). E.g., a practical minimum >0 is clear from the context of the expression "present at a concentration less than 10 wt %". Alternatively, the lower endpoint may be greater than the absolute minimum (e.g., >0%). "May" confers a choice, not an imperative. "Operative" means functionally effective. E.g., "operative contact" comprises functionally effective touching, e.g., as for modifying, coating, adhering, sealing, or filling. The operative contact may be direct physical touching, alternatively indirect touching, provided it is effective for its intended purpose. "Optionally" means is absent (or excluded), alternatively is present (or included). Any ranges relied upon herein describe and contemplate all ranges and subranges including endpoints and whole and/or fractional values therein, unless otherwise stated or indicated elsewhere herein. A disclosed endpoint or individual number between endpoints of a disclosed range or subrange may be relied upon and provides adequate support for specific inventive embodiments. Any reference to thereof shall refer to, and may be amended to be replaced by, that immediately preceding element, member, feature, limitation, list, or group to which reference is being made.

The description of this invention may also make use of any one or more of the following technical words, terms and expressions. Any reference to an amount, concentration, or ratio of amounts is based on weight, unless otherwise stated or indicated elsewhere herein. Any reference to a chemical element, a Group or Groups of chemical elements, or a Periodic Table of the Elements shall mean the chemical elements, Group(s), and Periodic Table of the Elements published by IUPAC, version dated 1 May 2013; see iupac.org/reports/periodic_table/). IUPAC is the International Union of Pure and Applied Chemistry (IUPAC Secretariat, Research Triangle Park, North Carolina, USA). The intended meaning of any chemical term is that definition promulgated by IUPAC, unless otherwise stated or indicated elsewhere herein. Any reference to a material property (e.g., viscosity) or a test method for measuring same shall be that property measured at or that method conducted at 23 degrees Celsius (° C.), unless otherwise stated or indicated elsewhere herein. Any reference to an organic group or molecule containing a C—H functionality means the organic group or molecule independently may be unsubstituted or substituted with one or more substituents, unless otherwise stated or indicated elsewhere herein. Examples of such organic groups are the univalent groups: hydrocarbyl, heterohydrocarbyl, and organoheteryl; and the divalent groups hydrocarbylene, heterohydrocarbylene, and organoheterylene. Examples of heteroatoms of the heterohydrocarbyl and organoheteryl are O, N, S, and P; alternatively O, N, or S; alternatively O or N; alternatively N; alternatively O. Unless otherwise stated or indicated elsewhere herein, each substituent independently is $R^s$, wherein each $R^s$ independently is a halogen atom, —$NH_2$, —NHR, —$NR_2$, —$NO_2$, —OH, —OR, oxo (=O), —C≡N, —C(=O)—R, —OC(=O)R, —C(=O)OH, —C(=O)OR, —SH, —SR, —SSH, —SSR, —SC(=O) R, —$SO_2R$, —$OSO_2R$, —$SiR_3$, and —$Si(OR)_3$; wherein each R independently is an unsubstituted ($C_1$-$C_{30}$) hydrocarbyl. Halogen atom is F, Cl, Br, or I; alternatively F, Cl, or Br; alternatively F or Cl; alternatively F; alternatively Cl. Any reference to "silicone" encompasses linear, branched, and mixtures of linear and branched polyorganosiloxane macromolecules, unless otherwise stated or indicated elsewhere herein. The branched polyorganosiloxane macromolecules include silsesquioxane resins and resin-linear polyorganosiloxane macromolecules, unless otherwise stated or indicated elsewhere herein. Any reference to "wt %" (weight percent) or parts (e.g., parts per million or ppm) is based on total weight of all ingredients used to make the composition, which total weight is 100 wt %, unless otherwise stated or indicated elsewhere herein.

Referring first to FIG. 1, a light emitting diode (LED) device 10, formed in accordance with the method of the present invention, includes an LED array 11 having a preformed lamination layer 12 (PL layer 12) conformally coated thereon. The PL layer 12 has become a conformed lamination layer in FIG. 1. In some embodiments the PL layer 12, and the related conformed lamination layer of the conformally coated article is constructed in a single layer form, as shown in FIGS. 1-6. In other embodiments the related conformed lamination layer is constructed as a multi-layer laminate (not shown) and the method comprises fabricating a conformally coated article comprising the multi-layer laminate form of the conformed lamination layer and the object. The multi-layer laminate form of the conformed lamination layer may be constructed by any suitable method such as either (a) manufacturing the PL layer 12 as a multi-layer laminate, and using the multi-layer laminate form of PL layer 12 in the inventive method; or (b) using a single layer form of the PL layer 12 in the inventive method to give the single-layer laminate form of the conformed lamination layer, and then repeating the inventive method at least one time, with the same or different single layer form of the PL layer 12, to give a conformally coated article comprising, among other things, the multi-layer form of the conformed lamination layer.

Figure 2:
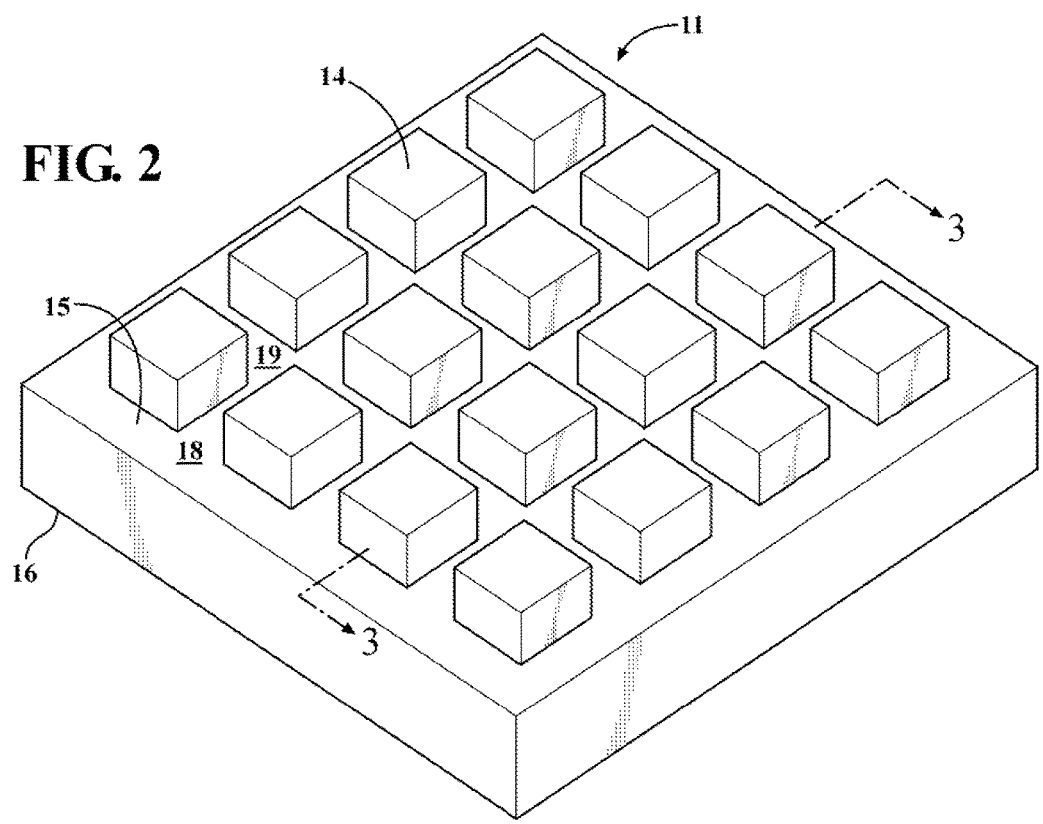
FIG. 2 a top view of and LED array having an array of LEDs mounted on a submount wafer according to one embodiment of the present invention.
Figure 3:
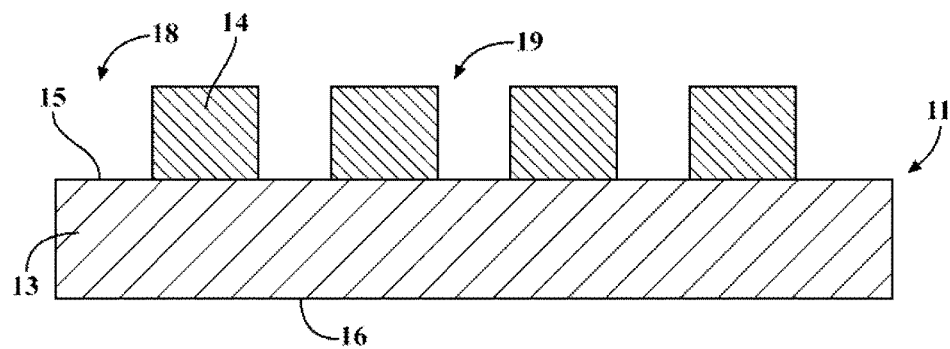
FIG. 3 is a side cross-sectional view of FIG. 2 taken along line 2-2.

As shown in FIGS. 2 and 3, the LED array 11 includes a submount wafer 13 (an example of a substrate, which is an example of the object), having a first side 15 and a second side 16. The first side 15 of the submount wafer 13 has a perimeter portion 18 surrounding an inner portion 19. A submount wafer 13 is a type of substrate that comprises a plurality of light emitting diodes (LEDs) 14 arranged to enable fabrication of a plurality of laminated LEDs 14, which may then be singulated after lamination to give a plurality of individual laminated LEDs. In some aspects the method employs the submount wafer as the substrate and further comprises singulating the conformally coated LED array to give a plurality of individual laminated LEDs.

The LED array 11 also includes an array of LEDs 14 disposed on the inner portion 19 of the first side 15 of a submount wafer 13. Each individual LED 14 is spaced apart from the next adjacent LED 14 along the first side 15 of the inner portion 19.

While FIGS. 1-3 illustrates one configuration of diodes 14 placed onto the inner portion 19 of the first side of the submount wafer, it is understood that the number, relative location, and spacing of the diodes 14 within the inner portion 19, can vary in terms of number, relative location, and/or spacing from that illustrated in FIGS. 1-3. Still further, the size and shape of each of the individual diodes 14 defining the array of LEDs may be the same or different. For example, the height of one diode 14 extending beyond the first side 15 of the submount wafer 13 may vary with respect to one or more of the additional diodes 14 in the array. Also, the relative size of the diodes 14 to the size of the submount wafer 13 is also not limited by the illustrated configuration in FIGS. 2 and 3.

Still further, the shape of the submount wafer 13, as illustrated in FIG. 1-3 as generally square along the first side 15, may vary in any number of ways. For example, the shape may be circular, rectangular, regularly shaped, or irregularly shaped, depending upon its intended use. In addition, the size of the perimeter portion 18 relative to the inner portion 19 of the submount wafer 13 may also vary form the size illustrated in FIG. 2.

Figure 4:
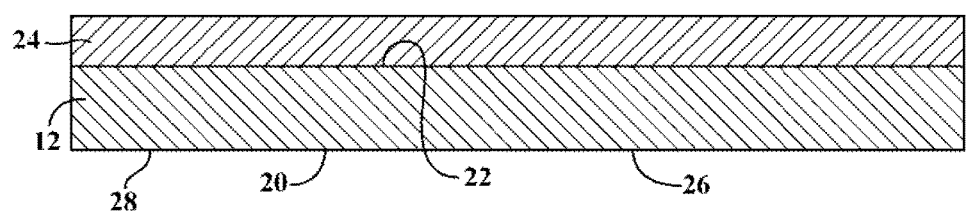
FIG. 4 is a cross-sectional view of the preformed lamination layer including a support layer.

As shown in FIG. 4, the PL layer 12 includes a first surface 20 and a second surface 22 opposite the first surface 20. The PL layer 12 includes a middle portion 26 surrounded by an edge portion 28. The PL layer 12 may be a free-standing film. For convenience, during the mounting and adhering steps the PL layer 12 may be coupled to a support layer 24 for ease of handling. Prior to being conformally coated to the LED array 11, a support layer 24 is typically coupled to one or both of the first surface 20 and second surface 22 (as shown in FIG. 4 the support layer 24 is coupled to the second surface 22) of the PL layer 12 for easy handling. The support layer or layers 24, if present, are removed prior to heat softening the middle portion 26 of the PL layer 12, prior to forming the gastight seal and prior to conforming the PL layer 12 to the LED array 11 as described further below. The heat-softened middle portion 26 of the PL layer 12 is obtained by heating the middle portion 26 to the first temperature in a single heating step prior to the PL layer 12 being conformally coated over the LED array 11. With the PL layer 12 generally shaped (sized or profiled) to correspond to the shape (size or profile) of the submount wafer 13 to which it is applied, wherein the middle portion 26 of the PL layer 12 generally corresponds in size and shape to the inner portion 19 of the submount wafer 13 and wherein the edge portion 28 generally corresponds in size and shape to the perimeter portion 18 of the submount wafer 13.

The preformed lamination layer 12 typically includes a phosphor material, typically in powder form, disposed within a substantially uncured thermosetting material. The PL layer 12 is deformable (i.e., flexible at room temperature)

The term "substantially uncured" refers to a thermosetting material has been prepared and kept at a temperature below about 30° C. so as not to cure (i.e., crosslink) other than a minor amount of crosslinking that may occur during the mixing of the components and in storing the resultant material. Coatings of a slurry of the thermosetting material or silicone binder, with or without phosphor material, may be dried at about 70° C. or less to give dried films thereof, and the dried films remain substantially uncured.

In certain embodiments, the substantially uncured thermosetting material is a silicone binder. In these embodiments, the PL layer 12 may be formed by mixing the phosphor material with the silicone binder to form a slurry and then applying the slurry to the support layer 24 and drying the slurry. The slurry may be formed with aid of a liquid vehicle such as an organic solvent such as toluene, butyl acetate, methyl ethyl ketone, dioxane, xylenes, or the like. The silicone binder or substantially uncured thermosetting material may be dispersed in the liquid vehicle to form a dispersion. The dispersion may have a nonvolatile content of 50 to 80 wt % (e.g., 65 wt %, 70 wt %, or 75 wt %). Phosphor particles may be mixed into the dispersion to form the slurry. The slurry may have a nonvolatile content of from >50 to 90 wt % (e.g., 70 wt %, 80 wt %, or 85 wt %). Nonvolatile content refers to concentration of all constituents except the liquid vehicle.

Referring back to FIG. 1, after the lamination method described below, the PL layer 12 is conformally coated to the LED array 11, thereby becoming a conformed lamination layer. As defined herein, a conformal coating of the PL layer 12 to the LED array 11 is achieved wherein the first surface 20 of the middle portion 26 of the PL layer 12 is brought into sealing contact over each of the exposed portions of the diodes 14 and into contact with the first side 15 of the submount wafer 13 between each of the diodes 14 within the inner portion 19. In addition, the edge portion 28 of the PL layer 12 is brought into sealing contact over the perimeter portion 18 of the first side of the submount wafer 13.

In this way, the PL layer 12 provides a protective and durable coating layer for the LEDs 14 of a consistent layer thickness that is substantially defect-free. The phosphor material contained within this conformed layer having uniform and consistent thickness allows light emitted from the diodes 14 individually and collective to be directed to provide a desired light effect.

As noted above, in some embodiments this invention is directed to vacuum lamination methods for forming electronic and optoelectronic devices such as semiconductor devices. In some illustrative embodiments the present invention is directed to vacuum lamination methods for forming these LED devices 10 as illustrated in FIG. 1, with exemplary methods described below with respect to the logic flow diagrams of FIGS. 7 and 8 below.

Figure 6:
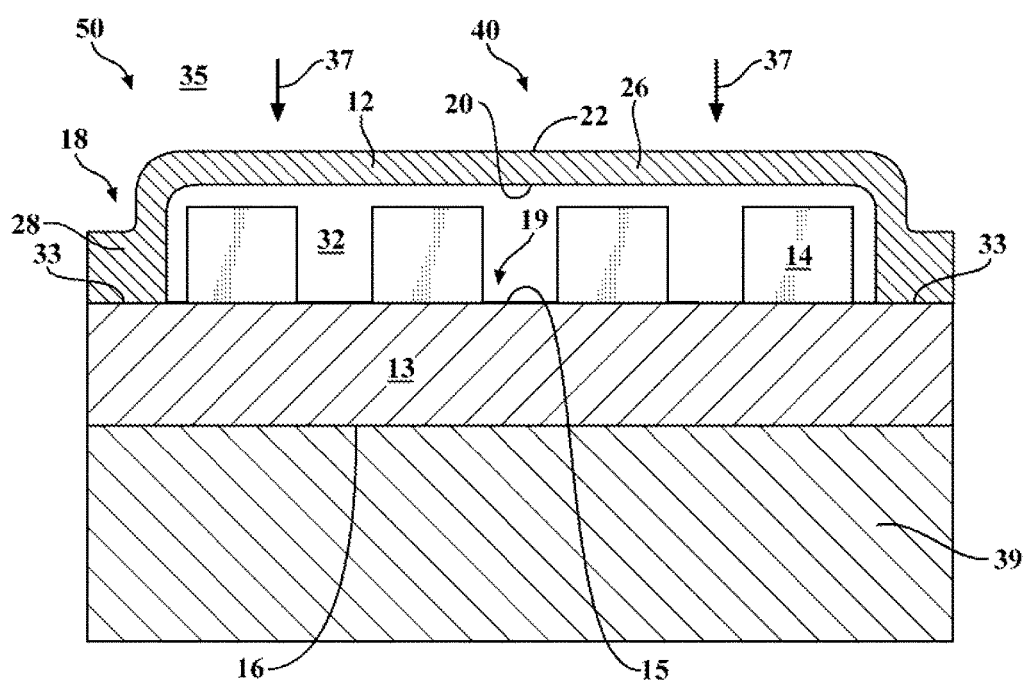
FIG. 6 is cross-sectional view of the preformed lamination layer coupled over the LED array after removal of the support layer but prior to being conformally coated to the LED array in which the edge portion of the preformed lamination layer is sealingly coupled to the perimeter portion of the submount wafer.

The method for forming the LED devices 10 in accordance with the present invention includes the use of a fabrication device (shown as 50 in FIG. 6) that includes a vacuum chamber (shown as 40 in FIG. 6).

Figure 7:
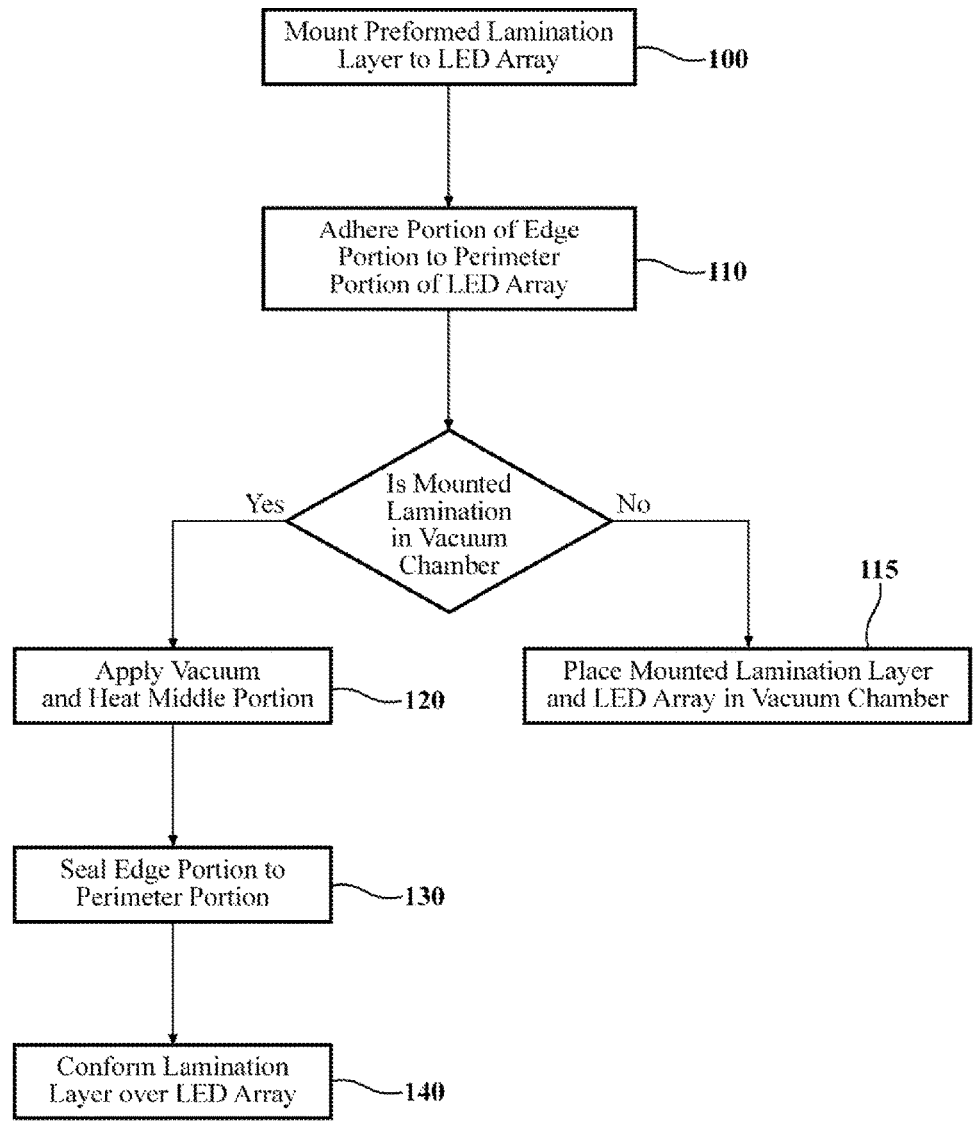
FIG. 7 is a logic flow diagram of a method for forming the LED device of FIG. 1 in accordance with one embodiment of the present invention.

In a first embodiment of the present invention, as illustrated in the logic flow diagram of FIG. 7, the method begins with Step 100, wherein the PL layer 12 is mounted over the LED array 11. The term "mounted", as provided herein, refers to the placement of the PL layer 12 adjacent to the LED array 11, and is not intended to refer to or suggest that the PL layer 12 is fastened or otherwise secured to the array 11.

Figure 5:
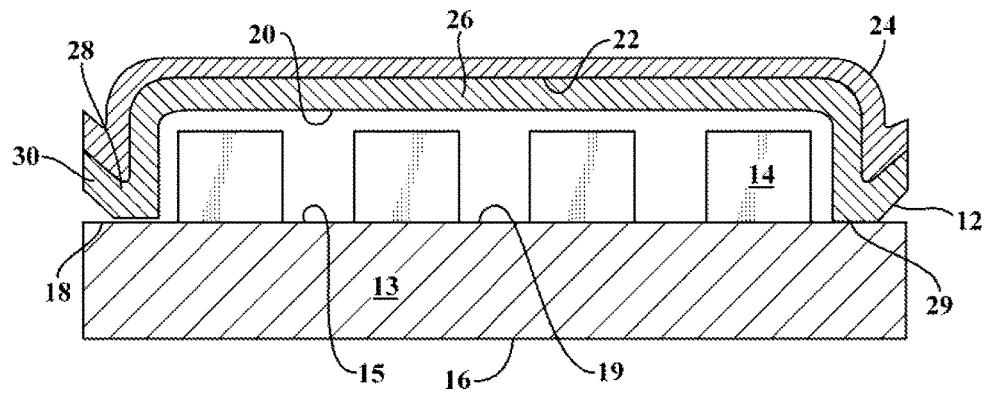
FIG. 5 is a cross-sectional view of the preformed lamination layer coupled over the LED array prior to removal of the support layer in which a portion of the edge portion of the preformed lamination layer is adhered to the perimeter portion of the submount wafer and another portion of the edge portion of the preformed lamination layer is not adhered to the perimeter portion of the submount wafer.

In certain embodiments, such as shown in FIGS. 5 and 6 prior to the PL layer 12 being conformally coated, the PL layer 12 is arranged wherein the first surface 20 of the PL layer 12 is located between the first side 15 of the submount wafer 13 and the second surface 22, and wherein the first side 15 of the submount wafer 13 is located between the first surface 20 and the second side 16. In this arrangement, the middle portion 26 of the PL layer 12 is adjacent to the inner portion 19 of the array 11, and therefore adjacent to the corresponding array of diodes 14, while the edge portion 28 is adjacent to the perimeter portion 18.

In certain embodiments, the mounting of the PL layer 12 to the LED array 11 of Step 100 is performed within the vacuum chamber 40, whereas in other embodiments the mounting of the PL layer 12 to the LED array 11 of Step 100 is performed prior to placing the PL layer 12 and LED array 11 into the vacuum chamber 40.

Next, in Step 110, as shown in FIG. 5, a portion 29 of the edge portion 28 of the PL layer 12 is adhered to the perimeter portion 18 of the first side 15 of the submount wafer 13. This may alternatively be referred to as tacking, or spot-tacking, the portion 29 of the edge portion to the perimeter portion 18. In this arrangement, another portion 30 of the edge portion 28 is not adhered to the perimeter portion 18. As such, in Step 110, a gastight seal is not created along between the edge portion 28 and the perimeter portion 18. See also FIG. 10.

In this step, the portion 29 is heated to a first temperature to soften the portion 29 (i.e., to make the portion 29 flowable). In addition, the middle portion 26 and the portion 30 of the PL layer 12 are maintained a temperature below the first temperature (i.e., the middle portion 26 and the portion 30 are not softened or otherwise made flowable). In some embodiments portion 29 is heated by pressing on the support layer 24 at a location opposite portion 29 while not pressing on the support layer 24 at a location opposite portion 30 such that portion 29 of the edge portion 28 of the PL layer 12 is adhered to the perimeter portion 18 of the first side 15 of the submount wafer 13, while portion 30 of the PL layer 12 is not adhered to the perimeter portion 18 of the first side 15 of the submount wafer 13.

At this first temperature, in addition to affecting the flow properties of the PL layer 12, the substantially uncured thermosetting material of the portion 29 of the PL layer 12 begins to react (i.e., begins to crosslink and cure), therein reducing the flow properties of the portion 29 over time as the degree of crosslinking increases. Thus, the portion 29 of the PL layer 12 becomes highly flowable upon reaching the first temperature, and then subsequently becomes less flowable as the degree of crosslinking within the portion 29 of the PL layer 12 increases.

The first temperature is dependent upon the rheological properties and the curing properties (i.e., crosslinking) of the composition of the uncured thermosetting material used in the PL layer 12. The first temperature also cannot exceed the temperature wherein the chemical or physical properties of the submount wafer 13 or diodes 14 are negatively impacted. When the uncured thermosetting materials include a silicone binder, as described above, the first temperature is generally in the range of 110°-170° C., alternatively 110° to 150° C., alternatively 120° to 140° C., alternatively 150°-170° C., alternatively a temperature used in the examples later, to achieve flow and begin the crosslinking process, although the first temperature may be higher or lower depending upon the particular chemistry of the material used.

In certain embodiments, a heater device (shown as 39 in FIG. 6) that is positioned to be in thermal communication with the portion 29 of the PL layer 12. The term "thermal communication", as referred to herein, describes wherein the heater device 39, when activated, is able to increase the temperature of the portion of the PL layer 12 to which it is directed. Thus, for example, the heater device 39 may be a device that is capable of radiating heat to a desired portion of the PL layer 12 (wherein the device is either brought into contact with, or closely coupled to, the PL layer 12) to raise the temperature of the PL layer 12 to the first temperature. For example, the heater device 39 may be a hot plate positioned to directly contact or be closely coupled to a desired location on the PL layer 12. Alternatively, the heater device 39 may be an infrared light emitting lamp or laser.

Alternatively, the heater device 39 may be able to heat the PL layer 12 by methods other than by radiating heat. For example, the heater device 39 may be a laser, alternatively an infrared lamp, which directs electromagnetic radiation to a desired portion of the PL layer 12.

In certain embodiments wherein Step 110 occurs in the vacuum chamber 40, the heater device 39 is positioned within a portion of the vacuum chamber 40 such that it may be directed to the portion 29 of the PL layer 12.

Next, again as shown in FIG. 5, the softened portion 29 heated to the first temperature is pressed to the perimeter portion until adhesion is obtained between the first surface 20 of the softened portion 29 and the perimeter portion 18, and wherein adhesion is not obtained between the another portion 30 and the perimeter portion 18. The pressing may be done by applying pressure to the second surface 22 manually, through the use of a mechanical device, or by any other means that can create sufficient force to obtain adhesion between the softened portion 29 and the perimeter portion 18.

In certain embodiments, the heating and pressing steps are done simultaneously, while in other embodiments the portion 29 may first be heated to the first temperature prior to being pressed onto the perimeter portion 18

In certain embodiments, wherein the PL layer 12 and LED array 11 have been introduced within the vacuum chamber 40, Step 110 may be performed wherein a vacuum has been applied within the vacuum chamber 40.

In certain embodiments, wherein the PL layer 12 includes a support layer 24 coupled to the second surface 22, Step 110 further includes removing (not shown in FIG. 7) the support layer 24 from the second surface 22 prior to Step 120 below. In certain of these embodiments, the support layer 24 is removed from the second surface 20 by applying a pressure sensitive adhesive (PSA) tape to the support layer 24 to adhere it to the support layer 24 and pulling the PSA tape and adhered support layer 24 away from the second surface 20. Other techniques may be used to remove the support layer 24 from the second surface 20 such as using forceps or a knife blade to apply a mechanical force to the support layer 24 so as to separate it from the second surface 20.

Figure 5A:
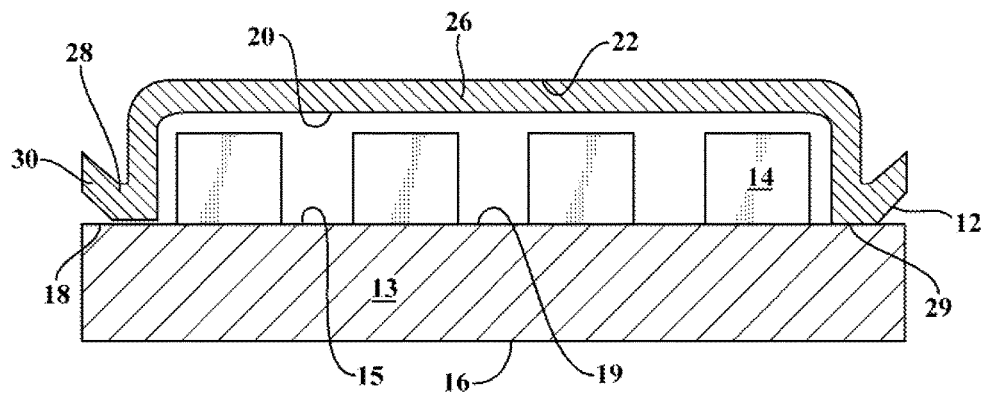
FIG. 5A is a cross-sectional view of the preformed lamination layer coupled over the LED array after removal of the support layer (shown in FIG. 5) in which a portion of the edge portion of the preformed lamination layer is adhered to the perimeter portion of the submount wafer and another portion of the edge portion of the preformed lamination layer is not adhered to the perimeter portion of the submount wafer.

FIG. 5A is a cross-sectional view of the PL layer 12 coupled over the LED array 11 after removal of the support layer 24 (not shown) in which a portion 29 of the edge portion 28 of the PL layer 12 is adhered to the perimeter portion 18 of the submount wafer 13 and another portion 30 of the edge portion 28 of the PL layer 12 is not adhered to the perimeter portion 18 of the submount wafer 13.

Next, in Step 115, in certain embodiments, wherein Step 110 is not performed in the vacuum chamber 40, the LED array 11 of a submount wafer 13 having the portion 29 adhered to the perimeter portion 18 is placed into the vacuum chamber 40 of the fabrication device 50. Alternatively, wherein Step 110 is performed in the vacuum chamber 40, the logic proceeds to Step 120.

In Step 120, a vacuum is applied within the vacuum chamber 40, and the PL layer 12, including both the edge portion 28 (and specifically portion 30 of the edge portion 28) and the middle portion 26, are heated to the first temperature to soften the middle portion 26 and portion 30 (i.e., make them flowable). The heat-softened middle portion 26 is obtained by heating the middle portion 26 of the PL layer 12 to the first temperature in a single heating step prior to the PL layer 12 being conformally coated over the LED array 11. Any support layer 24 has been removed before proceeding with step 120. The heating may occur after the vacuum is completely applied. Alternatively, the heating may occur simultaneously with applying the vacuum as long as the vacuum chamber is evacuated before the middle portion 26 and edge portion 28 (specifically portion 30 of the edge portion 28).

In certain embodiments, a heater device 39, that is the same or different from the heater device 39 described above in Step 110, may be used to heat the preformed layer 12 to the first temperature.

In certain embodiments, the heater device 39 is a heater device 39, such as a hot plate, that is positioned within the vacuum chamber 40 and in a position adjacent to, but not in thermal communication with, the second side 16 of the LED array 11 (i.e., wherein the second side 16 is positioned between the heater device 39 and the first side 15 of the LED array 11 and wherein the heater device 39 does not raise the temperature of the LED array 11 and mounted layer 12 even if activated). In these embodiments, to heat the PL layer 12, as in Step 110, the LED array 11 is moved from a first position not in thermal communication with the heater device 39 to a second position in thermal communication device (i.e., the second side 16 of the LED array 11 is moved closer to or in contact with the heater device 39). In this second position, when the heater device 39 is activated, heat is transferred to the LED array and to the mounted layer 12 to heat the middle portion 26 and portion 30 to the first temperature to soften the middle portion 26 and portion 30 of the PL layer 12, as described above.

In certain of these embodiments, the vacuum chamber 40 includes an external frame having at least one displaceable structure that is moveable between an engaged position and a disengaged position. In the engaged position (corresponding to the first position described in the previous paragraph), the second side 16 of the LED array 11 is disposed on the at least one displaceable structure such that it is suspended adjacent to the heater device 39, wherein the LED array 11 is therefore not in thermal communication with the heater device 39. When the at least one displaceable structure is moved from the engaged position to the disengaged position, the LED array 11 is no longer in contact at least one displaceable structure, therein allowing the LED array 11 to move into thermal communication with the heater device 39 (i.e., move to the second position), which therefore allows the LED array and film to be heated when the heater portion is activated.

In certain of these embodiments, the displaceable structure is a push pin or spring which can extend externally from the external frame in the engaged position and recede into the frame in the disengaged position.

In Step 130, the softened edge portion 28 is sealed to the perimeter portion 18 under the applied vacuum, thereby creating a sealed perimeter 33 between the edge portion 28 and the perimeter portion 18. During this sealing process, similar to what is described above, the substantially uncured thermosetting material of the portion 30 of the PL layer 12 begins to react (i.e., crosslink or cure), therein reducing the flow properties of the portion 30 as the degree of crosslinking increases.

Still further, as shown in FIG. 6, a gastight inner region 32 is created, which is defined within the space between the softened middle portion 26, the first side 15 of the submount wafer 13 and the sealed perimeter 33. In other words, gas flow is prevented from moving from the gastight portion 32, through the sealed perimeter 33, and to the remainder of the vacuum chamber 40, otherwise referred to as area (shown as 35 in FIG. 6) of vacuum chamber 40, and vice versa.

In Step 140, after the sealed perimeter 33 is created, the entire lamination layer 12 is conformed over the LED array 11. This is accomplished by raising the gas pressure within the area 35 of the vacuum chamber 40 relative to the gas pressure in the gastight inner region 32. The gas pressure may be raised within the area 35 by breaking the applied vacuum in the vacuum chamber 40 and allowing a gas to enter the vacuum chamber 40. The breaking the applied vacuum and allowing a gas to enter the vacuum chamber 40 may comprise venting or opening the vacuum chamber 40 to an environmental atmosphere (e.g., air) and/or (affirmatively) introducing a gas into the vacuum chamber 40 (e.g., from a source of compressed gas). The gas pressure in the vacuum chamber may be raised to a pressure greater than the reduced gas pressure in the gastight inner region 32 sufficient to achieve the conformal coating step, such as to a pressure from greater than the reduced gas pressure to a pressure less than ambient pressure (e.g., <101 kilopascals (kPa)), to ambient pressure (about 101 kPa), or to a pressure greater than ambient pressure, e.g., up to 200 kPa. The increased pressure in area 35 therefore exerts force on the second surface 22 of the softened PL layer 12 (shown by arrow 37 in FIG. 6), therein pushing the first surface 20 into sealing (i.e., conformal) contact with each of the features present on the first side 15 of the LED array 11, including over each of the array of diodes 14, over the inner portion 19 of the first side 15 of the wafer submount 13 between the diodes 14, and over first side of the perimeter portion 18 of the wafer submount 13.

As the heated layer 12 is brought into contact over the LED array 11, the substantially uncured thermosetting material of the middle portion 26 and portion 30 of the PL layer 12 continues to react and cure. Over time, the entire layer 12 forms a cured and conformed layer 12 over the entire first surface 15 of the LED array 11.

In certain embodiments, the gas pressure increase of Step 140 is created by removing the vacuum from the vacuum chamber 40 (i.e. venting the vacuum chamber 40), thereby increasing the gas pressure within the vacuum chamber 40 in area 35. Still further, in other embodiments, the gas pressure in area 35 may alternatively or further be increased in Step 140 by introducing additional gas into the area 35 of the vacuum chamber 40. The gas pressure may be raised to ambient pressure, alternatively to a pressure greater than 101 kPa, e.g., up to 200 kPa.

The present invention also provides an alternative lamination method than the embodiment provided in FIG. 7. In this method, as described in conjunction with the logic flow diagram illustrated in FIG. 8, the entire edge portion 28 of the PL layer 12 is sealed to the perimeter 18 portion in a single step, as opposed to first tacking (or adhering) a portion 29 of the edge portion 28 in a first step (Step 110 above) and then subsequently sealing the entire edge portion 28 to the perimeter portion 18 (Step 130 above) as described in conjunction with the logic flow diagram of FIG. 7.

Figure 8:
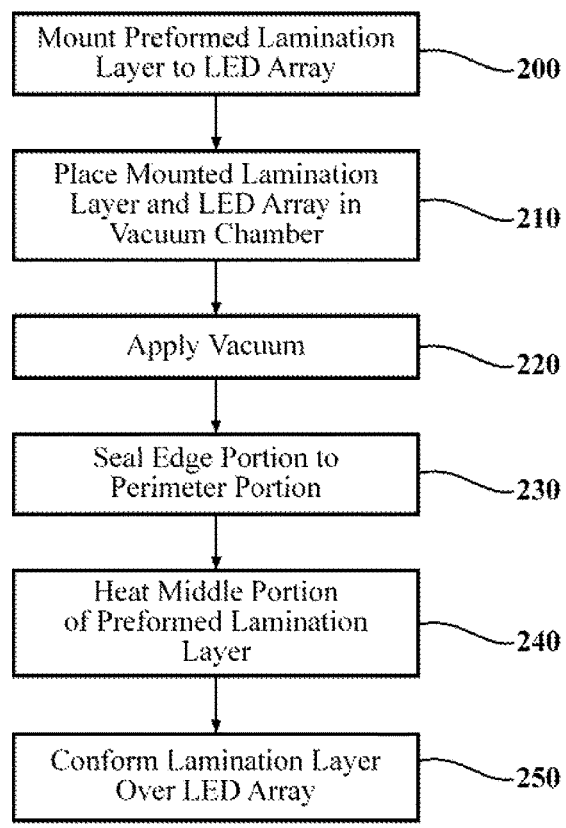
FIG. 8 is a logic flow diagram of a method for forming the LED device of FIG. 1 in accordance with another embodiment of the present invention.

Referring to FIG. 8, the lamination method begins with Step 200, wherein the PL layer 12 is mounted over the LED array 11. The method of Step 200 is substantially as provided above with respect to Step 100 of FIG. 7 and not repeated herein.

Similar to Step 100, in certain embodiments, the mounting of the PL layer 12 to the LED array 11 of Step 200 is performed within the vacuum chamber 40, whereas in other embodiments the mounting of the PL layer 12 to the LED array 11 of Step 200 is performed prior to placing the PL layer 12 and LED array 11 into the vacuum chamber 40.

Next, in Step 210, in certain embodiments, wherein Step 200 is not performed in the vacuum chamber 40, the LED array 11 having the mounted PL layer 12 is placed into the vacuum chamber 40 of the fabrication device 50. Alternatively, wherein Step 200 is performed in the vacuum chamber 40, the logic proceeds to Step 120. Any support layer (e.g., 24) has been removed before proceeding with step 220.

In Step 220, a vacuum is applied within the vacuum chamber 40, and the edge portion 28 of the PL layer 12 is heated to the first temperature to soften the edge portion 28 (i.e., make them flowable).

In Step 230, the softened edge portion 28 is sealed to the perimeter portion 18 under the applied vacuum, thereby creating a sealed perimeter 33 between the edge portion 28 and the perimeter portion 18. During this sealing process, similar to what is described above, the substantially uncured thermosetting material of the edge portion 28 of the PL layer 12 begins to react (i.e., crosslink or cure), therein reducing the flow properties of the edge portion 28 as the degree of crosslinking increases.

Still further, a gastight inner region 32 is created, which is defined within the space between the middle portion 26, the first side 15 of the submount wafer 13 and the sealed perimeter 33. In other words, gas flow is prevented from moving from the gastight portion 32, through the sealed perimeter 33, and to the remainder 35 of the vacuum chamber 40, and vice versa.

In certain embodiments, wherein the PL layer 12 includes a support layer 24 coupled to the second surface 22, Step 230 further includes removing the support layer 24 from the second surface 22 prior to Step 240 below. The support layer 24 may be removed prior to beginning sealing (before Step 230). In certain of these embodiments, the support layer 24 is removed from the second surface 20 by applying a pressure sensitive adhesive (PSA) tape to the support layer 24 to adhere it to the support layer 24 and pulling the PSA tape and adhered support layer 24 away from the second surface 20.

Next, in Step 240, while still under vacuum, the PL layer 12, including both the edge portion 28 and the middle portion 26, are heated to the first temperature to soften the middle portion 26 (i.e., make the middle portion flowable). The heat-softened middle portion 26 is obtained by heating the middle portion 26 of the PL layer 12 to the first temperature in a single heating step prior to the PL layer 12 being conformally coated over the LED array 11.

In certain embodiments, a heater device 39, that is the same or different from the heater device 39 described above in anyone of Steps 110, Step 230, may be used to heat the preformed layer 12 to the first temperature.

In certain embodiments, the heater device 39 is a heater device 39, such as a hot plate, that is positioned within the vacuum chamber 40 and in a position adjacent to, but not in thermal communication with, the second side 16 of the LED array 11 (i.e., wherein the second side 16 is positioned between the heater device 39 and the first side 15 of the LED array 11 and wherein the heater device 39 does not raise the temperature of the LED array 11 and mounted layer 12 even if activated). In these embodiments, to heat the PL layer 12, as in Step 110, the LED array 11 is moved from a first position not in thermal communication with the heater device 39 to a second position in thermal communication device (i.e., the second side 16 of the LED array 11 is moved closer to or in contact with the heater device 39). In this second position, when the heater device 39 is activated, heat is transferred to the LED array and to the mounted layer 12 to heat the middle portion 26 and portion 30 to the first temperature to soften the middle portion 26 and portion 30 of the PL layer 12, as described above.

In certain of these embodiments, the vacuum chamber 40 includes an external frame having at least one displaceable structure that is moveable between an engaged position and a disengaged position. In the engaged position (corresponding to the first position described in the previous paragraph), the second side 16 of the LED array 11 is disposed on the at least one displaceable structure such that it is suspended adjacent to the heater device 39, wherein the LED array 11 is therefore not in thermal communication with the heater device 39. When the at least one displaceable structure is moved from the engaged position to the disengaged position, the LED array 11 is no longer in contact at least one displaceable structure, therein allowing the LED array 11 to move into thermal communication with the heater device 39 (i.e., move to the second position), which therefore allows the LED array and film to be heated when the heater portion is activated. In certain embodiments, the displaceable structure may be moved so as to impinge on the edge portion 28 of the lamination layer 12 on to the perimeter portion 18 of the submount wafer 13, thereby forcing gastight sealing around the perimeter.

In certain of these embodiments, the displaceable structure is a push pin or spring which can extend from the external frame in the engaged position and recede into the frame in the disengaged position.

Next, in Step 250, after the middle portion 26 of the lamination layer 12 is heated to the first temperature, the entire lamination layer 12 is conformed over the LED array 11. This is accomplished by raising the gas pressure within the vacuum chamber 40 in area 35 relative to the gastight inner region 32, as described above in Step 140 of FIG. 7. The increased pressure in area 35 therefore exerts force on the second surface 22 of the softened PL layer 12, as shown by arrow 37 in FIG. 6, therein pushing the first surface 20 into sealing (i.e., conformal) contact with each of the features present on the first side 15 of the LED array 11, including over each of the array of diodes 14, over the inner portion 19 of the first side 15 of the wafer submount 13 between the diodes 14, and over first side of the perimeter portion 18 of the wafer submount 13.

As the heated layer 12 is brought into contact over the LED array 11, the substantially uncured thermosetting material of the middle portion 26 continues to react and cure. Over time, the entire layer 12 forms a cured and conformed layer over the entire first surface 15 of the LED array 11.

In certain embodiments, the gas pressure increase of Step 250 is created by removing the vacuum from the vacuum chamber 40 (i.e. venting the vacuum chamber 40), thereby increasing the gas pressure within area 35 relative to the gastight inner region 32. Still further, in other embodiments, the gas pressure may be increased in Step 250 by introducing additional gas into area 35 of the vacuum chamber 40.

The resultant LED device 10, as illustrated and described with respect to FIG. 1 above, as formed according to the method of the logic flow diagram associated with either FIG. 7 or 8, may then be removed from the vacuum chamber 40 of the fabrication device 50 and is available for use in a wide variety of lighting applications. The LED device 10 formed by the method of the present invention includes conformally coated PL layer 12 that provides a protective and durable coating layer for the LEDs 14 of a consistent layer thickness that is substantially defect-free. In FIG. 1 the PL layer 12 is shown as a conformed lamination layer. The phosphor material contained within this conformed layer 12, uniformly and consistently distributed within the conformed film layer 12, allows light emitted from the individual diodes 14, or collective from two or more of the array of diodes, to be directed or otherwise filtered to provide a desired light effect for its intended use.

The vacuum lamination methods of the present invention offer numerous advantages over two-step vacuum lamination methods utilizing two distinct heating steps. By limiting the heating of the middle portion (e.g., 26) of the preformed lamination layer (e.g., 12) to one heating step proceeding immediately before the preformed lamination layer (e.g., 12) is conformally coated over the LEDs (e.g., 14), the processing window for applying and conforming the preformed lamination layer (e.g., 12) is increased relative to the two-step vacuum lamination techniques in the prior art in which two distinct heating steps are utilized.

This increased processing window allows for the use of preformed lamination layers (e.g., 12) having different phosphor levels, in combination with additional or differing binder compositions having varying rheologies or cure speeds, which may need longer heating times than two-step vacuum lamination techniques allow. Resulting LED devices (e.g., 10) may therefore be formed having a wider variety of colors and quality of light than may be realized in LED devices formed with two-step vacuum lamination techniques.

Still further, the increased processing time allows for the PL layer 12 to be conformed over an array of diodes 14 having different feature heights (such as, for example, an array of diodes 14 including shorter conventional diodes and taller sapphire diodes) while still achieving uniform thickness of the phosphor layer on the highest height LEDs. As such, the desired lighting characteristics for these array of diodes can be precisely and predictably controlled.

In FIGS. 5 and 6 the PL layer 12 is shown not touching the tops of diodes 14. This configuration may occur when LED array has additional structures (not shown) that may be taller than diodes 14 and therefore may hold the PL layer 12 off of the diodes 14 prior to conformal coating step. Alternatively, if there are no additional structures that are taller than diodes 14, the PL layer 12 may be allowed to rest on and touch the tops (not indicated) of diodes 14.

Figure 9:
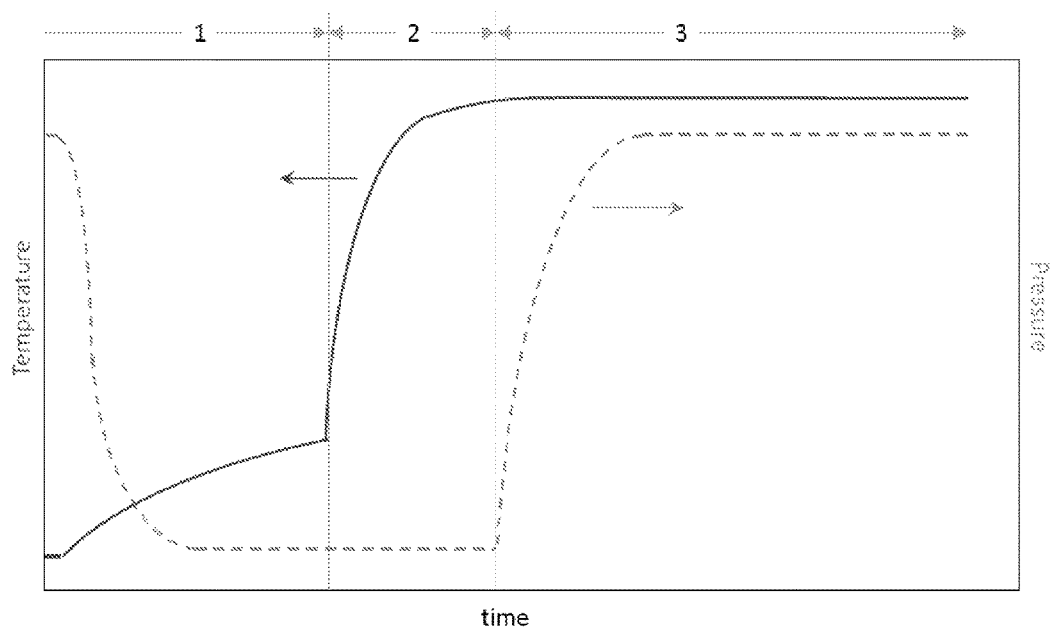
FIG. 9 is a graphical plot of a process coordinate of an embodiment of a method of forming the conformally coated article.

FIG. 9 is a graphical plot of a process coordinate of an embodiment of a method of forming the conformally coated article from the assembly comprising the preformed lamination layer and the object having a first surface in need of lamination and a second surface opposite the first surface. The process coordinate is divided into three general successive stages 1, 2 and 3, starting with the assembly at the beginning of stage 1 (far left) and ending with the conformally coated article at the end of stage 3 (far right). The process coordinate plots temperature (solid line) of the preformed lamination layer and pressure (dashed line) within the vacuum chamber of the fabrication device.

Referring again to FIG. 9, in stage 1, which independently comprises embodiments of the Apply Vacuum portion of Step 120 of FIG. 7 (and may not comprise the And Heat Middle Portion of Step 120) and comprises Step 220 of FIG. 8, the assembly is spaced apart from an activated heater (not shown) and the vacuum chamber is evacuated via the applied vacuum to remove gas from the vacuum chamber and from between the preformed lamination layer and the object. In stage 1 the process coordinate shows a substantial decrease in pressure within the vacuum chamber and at most a slight increase in the temperature of the preformed lamination layer of the assembly, wherein any temperature increase stage 1 is insignificant relative to the time it takes to evacuate the vacuum chamber and relative to the temperature needed for softening or curing the preformed lamination layer. Thus in stage 1, there is minimal or no heating of the preformed lamination layer. Stage 1 includes the applying a vacuum step, which occurs prior to the heating step. The applying a vacuum within the vacuum chamber removes gas from the vacuum chamber, including from between the first surface of the preformed lamination layer and the first surface of the object, so as to create the applied vacuum in the vacuum chamber of the fabrication device.

Referring again to FIG. 9, for all of stage 2, which independently comprises embodiments of Step 130 of FIG. 7 and Steps 230 and 240 of FIG. 8, the vacuum chamber and the space between the first surface of the preformed lamination layer and the first surface of the object are under the applied vacuum. At the beginning of stage 2 the assembly is moved toward the activated heater (or vice versa) until the second surface of the object is brought into thermal communication with the activated heater. As shown in stage 2, the thermal communication results in a rapid increase in temperature of the object, and in turn a rapid increase in the temperature of the preformed lamination layer in contact therewith. The heat-softened middle portion of the preformed lamination layer is obtained by heating the middle portion to the first temperature in a single heating step prior to the preformed lamination layer being conformally coated over the object. At the end of stage 2 the temperature of the edge portion and middle portion of the preformed lamination layer has reached a first temperature wherein the edge and middle portions of the preformed lamination layer soften and the edge portion seals to the perimeter portion of the first surface of the object, thereby forming the gastight seal under the applied vacuum and such that the assembly contains the gastight inner region. The gastight inner region contains the reduced gas pressure, which is effectively equal to the applied vacuum in the vacuum chamber. At the end of stage 2 there is no increase in pressure within the vacuum chamber and hence no contacting of the softened middle portion of the preformed lamination layer to the inner portion of the first surface of the article. Thus, stage 2 includes the heating and sealing steps, but not the conforming step.

Referring again to FIG. 9, in the beginning of stage 3, which independently comprises embodiments of Step 140 of FIG. 7 and Step 250 of FIG. 8, heating is maintained such that temperature of the preformed lamination layer is maintained at or above its softening temperature while gas pressure within the vacuum chamber is increased. The gas pressure within the vacuum chamber becomes greater than the reduced gas pressure within the gastight inner region. This is the beginning of the conforming step. The increase in gas pressure conformally pushes the heat-softened middle portion of the preformed lamination layer against the inner portion of the first surface of the object so as to fabricate the conformally coated article by the end of stage 3. Thus, stage 3 is the conforming step and occurs after the heating and sealing steps. Once the conformally coated article is fabricated, it may be cooled and removed from the fabrication device. The cooling and removing may be done in any order. The cooled and removed conformally coated article may be free-standing and is another aspect of this invention.

The first lamination temperature, duration of evacuation during the applied vacuum step, and timing of the applying a vacuum step relative to a heating step may depend on a number of factors that would be within the ordinary skill in the art to control. Such factors include pump rate of the fabrication device (i.e., how quickly a vacuum chamber of a given fabrication device may be evacuated), the vacuum chamber's thermal characteristics (i.e., its temperature and heat conduction ability), viscoelastic properties of the preformed lamination layer, and design and nature of the object being laminated (e.g., how small are the surface features on the inner portion of the first surface of the object, and thus how easily those surface features are conformally coated and how critical is achieving a quality conformal coating is for the use of the conformally coated article). It may help to ensure good evacuation of the vacuum chamber prior to heating the preformed lamination layer to form the gastight seal of the edge portion of the preformed lamination layer to the perimeter portion of the first surface of the object. The first temperature of the preformed lamination layer may be sufficiently high to soften the preformed lamination layer and to allow formation and maintenance of the gastight seal, while not too high to cause premature sealing prior to achieving an extent of removing of gas from between the preformed lamination layer and the object in order to avoid entrapping air or other gas under the preformed lamination layer. If the preformed lamination layer is composed of a material that generates volatiles upon heating to high temperature, the first temperature of the preformed lamination layer may be kept below the volatilization temperature. The rate of evacuation may be adjusted to be sufficiently faster than the rate of heating of the preformed lamination layer such that timing of achieving a satisfactory applied vacuum in the vacuum chamber is achieved before the preformed lamination layer begins to soften and trap air or other gas. The preformed lamination layer may begin to be heated before the applied vacuum is achieved, but the rate of evacuation is controlled such that any heating of the preformed lamination layer prior to achieving full applied vacuum is insufficient to soften the same. In some embodiments the heating of the edge portion of the preformed lamination layer is begun soon after the applied vacuum is achieved and is sufficiently rapid to enable forming of the gastight seal soon after (e.g., less than 5 minutes after) heating is begun. In other embodiments the heating of the edge portion of the preformed lamination layer is begun before the applied vacuum is achieved but the rate of heating is sufficiently slow relative to the rate of evacuating the vacuum chamber such that the edge portion of the preformed lamination layer does not reach the first temperature or soften until after the applied vacuum is achieved.

Figure 10:
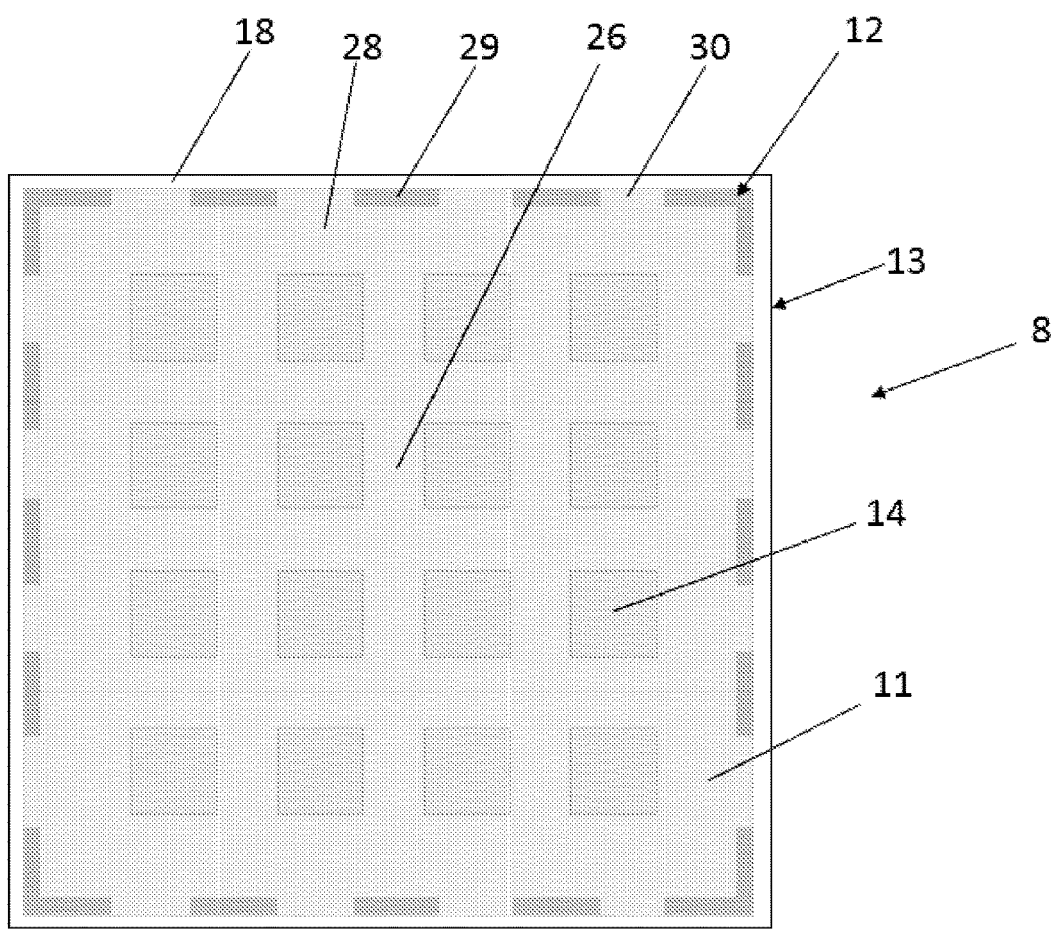
FIG. 10 is a top view of an assembly prepared by an embodiment of the method, wherein the assembly is that produced by an adhering step but before a gastight sealing step.

FIG. 10 is a top view of an assembly 8 prepared by an embodiment of the method, wherein the assembly 8 is produced by an adhering step but before a gastight sealing step. In FIG. 10, the PL layer 12 is mounted over an array 11 of diodes 14, and middle portion 26 of the PL layer 12 is not conformally coating diodes 14. The edge portion 28 of the PL layer 12 is spot adhered at one or more locations 29 to the perimeter portion 18 of submount wafer 13 and not adhered at one or more locations 30 to perimeter portion 18 of submount wafer 13. The assembly 8 is ready for the applying vacuum step or the introducing step and applying vacuum step, etc.

In some embodiments the inventive embodiments are any one of the following numbered aspects 1 to 33.

Aspect 1. A method for fabricating a light emitting diode device in a fabrication device having a vacuum chamber, the method comprising: (A) mounting a preformed lamination layer having a first surface and a second surface over a light emitting diode (LED) array, said LED array comprising an array of light emitting diodes disposed on an inner portion of a first side of a submount wafer, said submount wafer further including a perimeter portion surrounding said inner portion and a second side opposite said first side; wherein said first surface of said preformed lamination layer is located between said first side of said submount wafer and said second surface of said preformed lamination layer, said preformed lamination layer having a middle portion surrounded by an edge portion; (B) adhering a portion of said edge portion of said preformed lamination layer to said perimeter portion of said first side of said submount wafer; (C) introducing said LED array and said preformed lamination layer to the vacuum chamber; (D) after step (C), applying a vacuum within the vacuum chamber and heating said preformed lamination layer to a first temperature sufficient to soften said edge portion and said middle portion of said preformed lamination layer; (E) sealing said softened edge portion to said perimeter portion under said applied vacuum to create an gastight seal there between, thereby creating an gastight inner region defined by said gastight seal, said first surface of said preformed lamination layer and said first side of said submount wafer; and (F) after step (E), conforming said softened preformed lamination layer over said LED array by increasing the gas pressure within the vacuum chamber in an area not defined by said gastight inner region to a pressure greater than the gas pressure within said gastight inner region. The heat-softened middle portion of the preformed lamination layer is obtained by heating the middle portion of the preformed lamination layer to the first temperature in a single heating step prior to the preformed lamination layer being conformally coated over the LED array.

Aspect 2. The method according to aspect 1 wherein step (C) occurs prior to step (B).

Aspect 3. The method according to aspect 1 or aspect 2 wherein step (C) occurs prior to step (A).

Aspect 4. The method according to aspect 1 wherein step (C) occurs after step (A) and step (B).

Aspect 5. The method according to any one preceding aspect wherein step (B) comprises: (B1) heating a portion of said edge portion to said first temperature to soften said portion of said edge portion of said preformed lamination layer while maintaining said middle portion of said preformed lamination layer and another portion of said edge portion at a temperature below said first temperature; and (B2) pressing said softened portion of said edge portion to said perimeter portion until adhesion is obtained between said first surface of said softened edge portion of said preformed lamination layer and said perimeter portion and wherein adhesion is not obtained between said another portion of said edge portion such that said gastight inner portion is not created.

Aspect 6. The method according to aspect 5 wherein steps (B1) and (B2) are performed simultaneously.

Aspect 7. The method according to any one preceding aspect wherein step (E) comprises: (E1) pressing said softened edge portion against said perimeter portion under said applied vacuum to create a gastight seal there between, thereby creating a gastight inner region defined by said gastight seal, said first surface of said preformed lamination layer and said first side of said submount wafer.

Aspect 8. The method according to any one preceding aspect wherein step (F) comprises: (F1) after step (E), conforming said softened preformed lamination layer over said LED array by removing said applied vacuum within the vacuum chamber.

Aspect 9. The method according to any one of aspects 5 to 8 wherein the fabrication device includes first heater device in thermal communication with said perimeter portion of said submount wafer, and wherein step (B1) comprises: (B1-a) activating said first heater device to heat said perimeter portion of said submount wafer to said first temperature to soften said edge portion while maintaining said middle portion of said preformed lamination layer at a temperature below said first temperature.

Aspect 10. The method according to any one preceding aspect wherein the fabrication device includes a second heater device in thermal communication with said preformed lamination layer, said second heater device the same or different than said first heater device; and wherein step (E) comprises: (E1) applying a vacuum within the vacuum chamber and activating said second heater device to heat said preformed lamination layer to said first temperature to soften said edge portion and said middle portion of said preformed lamination layer.

Aspect 11. The method according to any one of aspects 1 to 9 wherein the fabrication device includes a second heater device positioned adjacent to but not in thermal communication with said second side of said LED array, said second heater device the same or different from said first heater device; and wherein step (E) comprises: (E1) applying a vacuum within the vacuum chamber; (E2) moving said second side of said LED array into thermal communication with said second heater device; and (E3) activating said second heater device to heat said LED array when said LED array is in thermal communication with said second heater device, wherein the heating of said LED array heats said preformed lamination layer to said first temperature to soften said edge portion and soften said middle portion.

Aspect 12. The method according to aspect 11 wherein the vacuum chamber includes an external frame having at least one displaceable structure that is movable between an engaged position to a disengaged position, and wherein steps (A) and (C) comprise: (1) disposing said LED array onto said at least one displaceable structure, wherein said LED array comprising an array of light emitting diodes disposed on an inner portion of a first side of a submount wafer, said submount wafer further including a perimeter portion surrounding said inner portion and a second side opposite said first side, and wherein said second side of said LED array is adjacent to but not in thermal communication with said second heater device; and (2) mounting a preformed lamination layer having a first surface and a second surface over said LED array; wherein said first surface of said preformed lamination layer is located between said first side of said submount wafer and said second surface of said preformed lamination layer, said preformed lamination layer having a middle portion surrounded by an edge portion.

Aspect 13. The method according to aspect 12 wherein step (E2) comprises: (E2-a) moving said displaceable structure from said engaged position to said disengaged position to allow said second side of said LED array to move into thermal communication with said second heater device.

Aspect 14. The method according to any one preceding aspect wherein said preformed lamination layer includes a support layer coupled to said second surface, and wherein the method further comprises: (G) removing said support layer from said second surface after step (B) but prior to step (E).

Aspect 15. The method according to any one preceding aspect further comprising: (H) forming a preformed lamination layer comprising a phosphor material disposed in a substantially uncured thermosetting material.

Aspect 16. The method according to any one of aspects 1 to 14 further comprising: (H) forming a preformed lamination layer comprising a phosphor material disposed in a silicone binder.

Aspect 17. The method according to aspect 14 further comprising: (H) forming a preformed lamination layer coupled to a support layer by: (1) mixing a phosphor material with a silicone binder to form a slurry; (2) dispensing said slurry onto said support layer; and (3) drying said slurry.

Aspect 18. A method for fabricating a light emitting diode device in a fabrication device having a vacuum chamber, the method comprising: (A) mounting a preformed lamination layer having a first surface and a second surface over a light emitting diode (LED) array, said LED array comprising an array of light emitting diodes disposed on an inner portion of a first side of a submount wafer, said submount wafer further including a perimeter portion surrounding said inner portion and a second side opposite said first side; wherein said first surface of said preformed lamination layer is located between said first side of said submount wafer and said second surface of said preformed lamination layer, said reformed lamination layer having a middle portion surrounded by an edge portion; (B) introducing said LED array and said preformed lamination layer to the vacuum chamber; (C) after step (B), applying a vacuum within the vacuum chamber; (D) sealing said edge portion to said perimeter portion under said applied vacuum to create an gastight seal there between, thereby creating an gastight inner region defined by said gastight seal, said first surface of said preformed lamination layer and said first side of said submount wafer; (E) after step (D), heating said preformed lamination layer to a first temperature sufficient to soften said middle portion of said preformed lamination layer; and (F) conforming said softened preformed lamination layer over said LED array by increasing the gas pressure within the vacuum chamber in an area not defined by said gastight inner region to a pressure greater than the gas pressure within said gastight inner region. Alternatively, steps (D) and (E) occur simultaneously but at different rates such that the preformed lamination layer begins to be heated before the applied vacuum is achieved, but the rate of evacuation is controlled such that the heating of the preformed lamination layer prior to achieving full applied vacuum is insufficient to soften the same.

Aspect 19. The method according to aspect 18 wherein step (B) occurs prior to step (A).

Aspect 20. The method according to aspect 18 wherein step (B) occurs after step (A).

Aspect 21. The method according to any one of aspects 18 to 20 wherein step (D) comprises: (D1) heating said edge portion to said first temperature to soften said portion of said edge portion of said preformed lamination layer while maintaining said middle portion of said preformed lamination layer at a temperature below said first temperature; and (D2) pressing said softened portion of said edge portion to said perimeter portion until an gastight seal is obtained between said first surface of said softened edge portion of said preformed lamination layer and said perimeter portion of said submount wafer, thereby creating an gastight inner region defined by said gastight seal, said first surface of said preformed lamination layer and said first side of said submount wafer.

Aspect 22. The method according to aspect 21 wherein steps (D1) and (D2) are performed simultaneously.

Aspect 23. The method according to any one of aspects 18 to 21 wherein step (F) comprises: (F1) conforming said softened preformed lamination layer over said LED array by removing said applied vacuum within the vacuum chamber.

Aspect 24. The method according to any one of aspects 21 to 23, wherein the fabrication device includes first heater device in thermal communication with said perimeter portion of said submount wafer, and wherein step (D1) comprises: (D1-a) activating said first heater device to heat said perimeter portion of said submount wafer to said first temperature to soften said edge portion while maintaining said middle portion of said preformed lamination layer at a temperature below said first temperature.

Aspect 25. The method according to any one of aspects 18 to 24 wherein the fabrication device includes a second heater device in thermal communication with said preformed lamination layer, said second heater device the same or different than said first heater device; and wherein step (E) comprises: (E1) activating said second heater device to heat said preformed lamination layer to said first temperature to soften said middle portion of said preformed lamination layer.

Aspect 26. The method according to any one of aspects 18 to 24 wherein the fabrication device includes a second heater device positioned adjacent to but not in thermal communication with said second side of said LED array, said second heater device the same or different from said first heater device; and wherein step (E) comprises: (E1) moving said second side of said LED array into thermal communication with said second heater device; and (E2) activating said second heater device to heat said LED array when said LED array is in thermal communication with said second heater device, wherein the heating of said LED array heats said preformed lamination layer to said first temperature to soften said edge portion and soften said middle portion.

Aspect 27. The method according to aspect 26 wherein the vacuum chamber includes an external frame having at least one displaceable structure that is movable between an engaged position to a disengaged position, and wherein steps (A) and (B) comprise: (1) disposing said LED array onto said at least one displaceable structure, wherein said LED array comprising an array of light emitting diodes disposed on an inner portion of a first side of a submount wafer, said submount wafer further including a perimeter portion surrounding said inner portion and a second side opposite said first side, and wherein said second side of said LED array is adjacent to but not in thermal communication with said second heater device; and (2) mounting a preformed lamination layer having a first surface and a second surface over said LED array; wherein said first surface of said preformed lamination layer is located between said first side of said submount wafer and said second surface of said preformed lamination layer, said preformed lamination layer having a middle portion surrounded by an edge portion.

Aspect 28. The method according to aspect 27 wherein step (E1) comprises: (E1-a) moving said displaceable structure from said engaged position to said disengaged position to allow said second side of said LED array to move into thermal communication with said second heater device. In certain embodiments, the displaceable structure may be moved so as to impinge on the edge portion 28 of the preformed lamination layer 12 on to the perimeter portion 18 of the submount wafer 13, thereby forcing gastight sealing around the perimeter of the submount wafer 13 to form the gastight inner region.

Aspect 29. The method according to any one of aspects 18 to 28 wherein said preformed lamination layer includes a support layer coupled to said second surface, and wherein the method further comprises: (G) removing said support layer from said second surface after step (D) but prior to step (E).

Aspect 30. The method according to any one of aspects 18 to 29 further comprising: (H) forming a preformed lamination layer comprising a phosphor material disposed in a substantially uncured thermosetting material.

Aspect 31. The method according to any one of aspects 18 to 29 further comprising: (H) forming a preformed lamination layer comprising a phosphor material disposed in a silicone binder.

Aspect 32. The method according to aspect 29 further comprising: (I) forming a preformed lamination layer coupled to a support layer by: (1) mixing a phosphor material with a silicone binder to form a slurry; (2) dispensing said slurry onto said support layer; and (3) drying said slurry.

Aspect 33. A light emitting diode device formed according to the method of any one preceding aspect.

In some embodiments the inventive aspects are any one of the following numbered aspects.

Aspect One. A method of fabricating a conformally coated article from an assembly that is housed in a vacuum chamber of a fabrication device; Wherein the vacuum chamber contains an applied vacuum; Wherein the assembly comprises a preformed lamination layer and an object having a surface in need of lamination; Wherein the preformed lamination layer has a first surface and a second surface opposite the first surface, and a heat-softened middle portion at a first temperature and surrounded by an edge portion; Wherein the object has a first surface and a second surface opposite the first surface, and the first surface being in need of lamination and comprising an inner portion and a perimeter portion surrounding the inner portion; Wherein the assembly is configured such that the first surface of the preformed lamination layer is positioned facing the first surface of the object, wherein the edge portion of the preformed lamination layer forms a gastight seal to the perimeter portion of the first surface of the object such that the assembly contains a gastight inner region defined by a combination of the gastight seal, the first surface of the preformed lamination layer and the first surface of the object, wherein the heat-softened middle portion of the preformed lamination layer is spaced apart from the inner portion of the first surface of the object by the gastight inner region, and wherein the gastight inner region contains a reduced gas pressure; Wherein the applied vacuum in the vacuum chamber is effectively equal to the reduced gas pressure in the gastight inner region of the assembly; and Wherein the method comprising: Conforming the heat-softened middle portion of the preformed lamination layer to the inner portion of the first surface of the object by increasing gas pressure within the vacuum chamber such that the gas pressure within the vacuum chamber is greater than the reduced gas pressure within the gastight inner region, thereby conformally pushing the heat-softened middle portion against the inner portion of the first surface of the object so as to fabricate the conformally coated article; Wherein the conformally coated article comprises a conformed lamination layer and the object, wherein the conformed lamination layer is formed from the preformed lamination layer and has a first surface and a second surface opposite the first surface, and a middle portion and an edge portion surrounding the middle portion; wherein the object has a first surface having an inner portion and a perimeter portion surrounding the inner portion, wherein the inner portion of the first surface of the object is conformally coated by the middle portion of the conformed lamination layer; and wherein the edge portion of the conformed lamination layer forms a gastight seal to the perimeter portion of the first surface of the object. The heat-softened middle portion of the preformed lamination layer is obtained by heating the middle portion of the preformed lamination layer to the first temperature in a single heating step prior to the preformed lamination layer being conformally coated over the object such as the light emitting diodes.

Aspect Two. The method of aspect one wherein in the conforming step the gas pressure is increased within the vacuum chamber by breaking the applied vacuum in the vacuum chamber of the fabrication device and allowing a gas to enter the vacuum chamber. The gas pressure may be increased within the vacuum chamber by venting the vacuum chamber in an environmental atmosphere (e.g., air) and/or by affirmatively introducing a gas into the vacuum chamber (e.g., from a source of compressed gas).

Aspect Three. The method of aspect one or two further comprising, prior to the conforming step, sealing, under the applied vacuum, the edge portion of the preformed lamination layer to the perimeter portion of the first surface of the object by contacting the edge portion of the preformed lamination layer to the perimeter portion of the first surface of the object so as to form the gastight seal and the gastight inner region of the assembly, wherein during the contacting the edge portion of the preformed lamination layer is characterized by being heat-softened at a second temperature, wherein the first and second temperatures are the same or different.

Aspect Four. The method of aspect three wherein the sealing step comprises pressing the heat-softened edge portion of the preformed lamination layer to the perimeter portion of the first surface of the object.

Aspect Five. The method of aspect two or three further comprising, prior to the sealing step, heating, under the applied vacuum, the edge portion of the preformed lamination layer to the first or second temperature, as the case may be, to form the heat-softened edge portion of the preformed lamination layer.

Aspect Six. The method of any preceding aspect further comprising, prior to the conforming step, heating, under the applied vacuum, the middle portion of the preformed lamination layer to the first temperature to soften the middle portion of the preformed lamination layer to form the heat-softened middle portion of the preformed lamination layer.

Aspect Seven. The method of aspect six wherein the fabrication device further includes a first heater device, which is positioned adjacent to the second surface of the object in such a way that any thermal communication between the first heater and the second surface of the object is insufficient to soften the preformed lamination layer; and Wherein the heating step comprises: Moving the second surface of the object into thermal communication with the first heater device, or vice versa; and Activating the first heater device so that it produces heat; Wherein the activated first heater device heats the object, which consequently heats the preformed lamination layer to the first temperature to independently soften the edge portion and the middle portion of the preformed lamination layer.

Aspect Eight. The method of aspect seven wherein the activating step is performed after the moving step.

Aspect Nine. The method according to aspect seven or eight wherein the vacuum chamber includes an external frame having at least one displaceable structure that is movable from an engaged position to a disengaged position, and wherein the assembly is disposed on the at least one displaceable structure to give a loaded displaceable structure, wherein the loaded displaceable structure is disposed in the engaged position; wherein the heating step comprises moving the loaded displaceable structure from the engaged position to the disengaged position to move the second surface of the object into thermal communication with the first heater device. In some aspects the at least one displaceable structure is also movable from the disengaged position back to the engaged position.

Aspect Ten. The method of any one of aspects five to nine further comprising, prior to the heating step, applying a vacuum within the vacuum chamber to remove gas from the vacuum chamber, including from between the first surface of the preformed lamination layer and the first surface of the object, so as to create the applied vacuum in the vacuum chamber of the fabrication device.

Aspect Eleven. The method of aspect ten further comprising, prior to the applying step, introducing the preformed lamination layer and the object into the vacuum chamber of the fabrication device.

Aspect Twelve. The method of aspect eleven further comprising, prior to the applying step and prior to, during or after the introducing step, mounting the preformed lamination layer against the object such that the first surface of the preformed lamination layer is positioned facing the first surface of the object.

Aspect Thirteen. The method of aspect twelve wherein the preformed lamination layer used in the mounting step is coupled to a support layer and wherein the method further comprises, after the mounting step and prior to the introducing step: Adhering a first subportion of the edge portion of the preformed lamination layer to a first subportion of the perimeter portion of the first surface of the object without adhering a second subportion of the edge portion of the preformed lamination layer to a second subportion of the perimeter portion of the first surface of the object, wherein the adhering step is performed while the preformed lamination layer is coupled to the support layer; and Removing, after the adhering step, the support layer from the mounted preformed lamination layer. In some embodiments the method of aspect ten further comprises each of aspects eleven to thirteen.

Aspect Fourteen. The method of aspect thirteen, wherein the adhering step comprises: Locally heating the first subportion of the edge portion of the preformed lamination layer to a third temperature to soften the first subportion of the edge portion of the preformed lamination layer while maintaining the middle portion of the preformed lamination layer and the second subportion of the edge portion of the preformed lamination layer at a temperature below the third temperature, wherein the third temperature independently is the same as or different than each of the first and second temperatures; and Pressing the softened first subportion of the edge portion of the preformed lamination layer to the first subportion of the perimeter portion of the first surface of the object until adhesion is obtained therebetween and wherein adhesion is not obtained between the second subportion of the edge portion of the preformed lamination layer and the second subportion of the perimeter portion of the first surface of the object such that the gastight inner region of the assembly is not created in this step.

Aspect Fifteen. The method of any preceding aspect wherein the object further comprises at least one additional feature in need of lamination, wherein the at least one additional feature is disposed in operative contact with the inner portion of the first surface of the object and within the gastight inner region of the assembly and wherein the at least one additional feature is conformally coated in the conforming step and by the conformed lamination layer in the conformally coated article.

Aspect Sixteen. The method of aspect fifteen wherein the at least one additional feature in need of lamination comprises an electronic device (e.g., a printed circuit board or a plurality of light emitting diodes), an optical device, a vehicle component, a building component (e.g., a window, door, or appliance), a medical device component, a machine component, a container, a healthcare product (such as laminating a plurality of a solid pharmaceutical dosage forms (pill, tablet, lozenge, capsule, and the like) to give a multi-dose package), or an appliance component.

Aspect Seventeen. The method of aspect sixteen wherein the object comprises a plurality of light emitting diodes (LEDs) and a submount wafer, wherein the submount wafer has a first surface and a second surface opposite the first surface and the first surface of the submount wafer has an inner portion and a perimeter portion surrounding the inner portion; wherein the LEDs are arrayed on the inner portion of the first surface of the submount wafer and wherein the LEDs and the inner portion of the first surface of the submount wafer together are in need of lamination.

Aspect Eighteen. The method according to any one preceding aspect, wherein the preformed lamination layer comprises a phosphor material disposed in a silicone binder or in a substantially uncured thermosetting material.

Aspect Nineteen. The method of any preceding aspect, further comprising removing the conformally coated article from the fabrication device.

Aspect Twenty. The method of any preceding aspect comprising a method for fabricating a light emitting diode device in a fabrication device having a vacuum chamber, the method comprising: (A) mounting a preformed lamination layer having a first surface and a second surface over a light emitting diode (LED) array, said LED array comprising an array of light emitting diodes disposed on an inner portion of a first side of a submount wafer, said submount wafer further including a perimeter portion surrounding said inner portion and a second side opposite said first side; wherein said first surface of said preformed lamination layer is located between said first side of said submount wafer and said second surface of said preformed lamination layer, said preformed lamination layer having a middle portion surrounded by an edge portion; (B) adhering a portion of said edge portion of said preformed lamination layer to said perimeter portion of said first side of said submount wafer; (C) introducing said LED array and said preformed lamination layer to the vacuum chamber; (D) after step (C), applying a vacuum within the vacuum chamber and heating said preformed lamination layer to a first temperature sufficient to soften said edge portion and said middle portion of said preformed lamination layer; (E) sealing said softened edge portion to said perimeter portion under said applied vacuum to create an gastight seal there between, thereby creating an gastight inner region defined by said gastight seal, said first surface of said preformed lamination layer and said first side of said submount wafer; and (F) after step (E), conforming said softened preformed lamination layer over said LED array by increasing the gas pressure within the vacuum chamber in an area not defined by said gastight inner region to a pressure greater than the gas pressure within said gastight inner region.

Aspect Twenty-one. The method of aspect twenty according to the method of any one of aspects 2 to 32.

Aspect Twenty-two. The conformally coated article prepared by the method of any preceding aspect.

In some aspects or embodiments, the silicone is a macromolecule or a collection of macromolecules of a resin-linear organosiloxane. Resin-linear polyorganosiloxane macromolecules may be hydrosilylation cured resin-linear organosiloxane block copolymers (R-LOB Copolymers). R-LOB Copolymers have a different monomer arrangement than those of non-block copolymers such as statistical, random or alternating copolymers. R-LOB Copolymers may be diblock, triblock, or higher block copolymers. R-LOB Copolymers are composed of macromolecules that are characterized by distinct linear blocks and distinct resin blocks. The linear blocks typically contain mostly, substantially all, or all D-type organosiloxane units, which are primarily bonded together to form bivalent straight chain polymeric segments (e.g., having from 10 to 400 units each), which bivalent straight chain polymeric segments are referred to herein as "linear blocks." The resin blocks contain a majority, substantially all, or all of T-type organosiloxane units or Q units, although typically they are T-type organosiloxane units. Typically, if there are any Q units ($SiO_{4/2}$) in the R-LOB Copolymer, they are relatively small in number (less than 5 mol % of all units). (In addition, the R-LOB Copolymers may contain a relatively small number* of M-type organosiloxane units ($R_3SiO_{1/2}$), wherein R is hydrocarbyl; *typically less than 5 mol % M-type units.) The T-type organosiloxane units are primarily bonded to each other to form polyvalent branched chain polymeric segments, which are referred to herein as "non-linear blocks." Thus, the R-LOB Copolymers are composed of macromolecules wherein the linear blocks are bonded to the non-linear blocks. In solid forms of the R-LOB Copolymer, a significant number of these non-linear blocks may aggregate together to form nano-domains. The aggregated non-linear blocks of the R-LOB Copolymers may be referred to as hard domains and the linear blocks as soft domains. The R-LOB Copolymers may be characterized by higher glass transition temperatures (Tg) than those of non-block copolymers. These R-LOB Copolymers may be designed to contain a low molar amount of unsaturated aliphatic groups, which enable cross-linking of the copolymers in downstream industrial applications such as sealing or encapsulating (opto)electronic devices. Some embodiments of these R-LOB Copolymers further contain an additional type of reactive group, which enables the R-LOB Copolymers so functionalized to be used in dual-cure mechanisms. Some R-LOB Copolymers are of the nanophase-separated type, which comprise nano-sized domains of linear blocks predominantly comprised of D units and of resin blocks predominantly comprised of T units.

Resin-linear polyorganosiloxane macromolecules may comprise a hydrosilylation-cured resin-linear organosiloxane block copolymer comprising: 40 to 90 mole percent D-type units of the formula [$R^1_2SiO_{2/2}$], 10 to 60 mole percent T-type units of the formula [$R^2SiO_{3/2}$], 0.5 to 35 mole percent silanol groups [Si—OH]; wherein each $R^1$ and $R^2$ independently is a ($C_1$-$C_{30}$)hydrocarbyl that has 0 aliphatic unsaturated bond or a ($C_1$-$C_{30}$)hydrocarbyl which comprises at least 1 aliphatic unsaturated bond, wherein the resin-linear organosiloxane block copolymer comprises from 0.5 to 5 mole percent of the ($C_1$-$C_{30}$)hydrocarbyl comprising at least one aliphatic unsaturated bond; wherein the D-type units [$R^1_2SiO_{2/2}$] are arranged in linear blocks having an average of from 100 to 300 D-type units [$R^1_2SiO_{2/2}$] per linear block and the T-type units [$R^2SiO_{3/2}$] are arranged in non-linear blocks having a molecular weight of at least 500 grams per mole (g/mol), wherein at least 30 mole percent of the non-linear blocks are crosslinked with each other and wherein each linear block is linked to at least one non-linear block via a divalent linker comprising a D-type or T-type siloxane unit. The resin-linear organosiloxane block copolymer may have a weight average molecular weight ($M_w$) of at least 20,000 g/mol.

Any resin-linear organosiloxane block copolymer is contemplated, including R-LOB Copolymers that are known in the art. E.g., see US 2014/0357827 A1; US 2013/0165602 A1; US 2013/0168727 A1; US 2013/171354 A1; US 2013/0172496 A1, which issued as U.S. Pat. No. 8,921,495 B2; and US 2013/0245187 A1.

Lamination Yield Test Method: in a conformally coated LED array containing x total number of LED diodes and thus x gaps between each pair of electrodes, the gaps are visually inspected to determine the number, f, of gaps that are completely filled with the conformal coating and the number, u, of gaps that are unfilled or have air pockets. The lamination yield (LY) is the number, f, of filled gaps divided by the total number, x, of gaps, expressed as a percent. LY=100(f/x). In some embodiments useful for testing lamination yield, an 11×12 LED array having x=132 LEDs is used and each of the x gaps is 100 micrometers (μm) wide, and LY≥80%, alternatively LY≥85%, alternatively LY≥89%, alternatively LY≥90%, alternatively LY≥93%, alternatively LY≥95%, alternatively LY≥96%, alternatively LY≥97%, alternatively LY≥98%, alternatively LY≥99%, alternatively LY 100%.

Object (1): LED array (1): an 11×12 array of LEDs (n=132 LEDs total) disposed on an inner portion of a first side of a submount wafer, wherein each LED is bonded to a different pair of rectangular pad electrodes spaced about 100 micrometers (μm) apart from each other and attached to the submount wafer.

Object (2): a 0.3 millimeter thick borosilicate glass sheet (Schott D 263 T eco thin glass) for use as a component of a window or tabletop.

Preformed lamination layer (1): a 100 μm thick free-standing dried film comprising 40 wt % of a resin-linear silicone and 60 wt % of a YAG:Ce phosphor admixed therein.

Preformed lamination layer (2): a 100 μm thick free-standing dried film comprising 40 wt % of a resin-linear silicone and 60 wt % of a phosphor blend admixed therein, wherein the phosphor blend is YAG:Ce (3 parts) and Eu doped nitride (1 part).

Preformed lamination layer (3): a 100 μm thick free-standing dried film comprising 20 wt % of a resin-linear silicone and 80 wt % of a YAG:Ce phosphor admixed therein.

Preformed lamination layer (4): a 55 μm thick freestanding dried film comprising 20 wt % of a resin-linear silicone and 80 wt % of a YAG:Ce phosphor admixed therein.

Preformed lamination layer (5): a 100 μm thick freestanding dried film of a resin-linear silicone.

Preformed lamination layer (6): a 100 μm thick freestanding dried film of an ethylene copolymer-based ionomer encapsulant (Du Pont 5400).

Preformed lamination layer (7): a heat-treated form of preformed lamination layer (5), having reduced tackiness compared to tackiness of preformed lamination layer (5). (May be made by subjecting preformed lamination layer (5) to heating at 150° C. for 90 seconds, and cooling to give preformed lamination layer (7).)

Support layer (1): FEP poly(tetrafluoroethylene) sheet is a transparent, thermoplastic film that is manufactured by DuPont and commercially available from American Durafilm (Holliston, Mass., USA) as "Teflon® FEP Film".

Support layer (2): a siliconized poly(ethylene terephthalate) sheet commercially available as Hostaphan 2SLKN from Mitsubishi.

Vacuum laminator (1): containing bladder and support springs. A fabrication device configured with a vacuum chamber containing a bladder, a hot plate capable of being heated to a temperature set point from 100° to 200° C., and support springs disposed to hold an object placed thereon above the hot plate such that an about 0.3 centimeter (cm) air gap exists between the hot plate and the bottom of the object.

Vacuum laminator (2): configured the same as vacuum laminator (1) except without the support springs. An object placed in vacuum laminator (2) is placed directly on the hot plate such that no air gap exists between the hot plate and the bottom of the object.

Preparation 1: preparation of preformed lamination layer (1). 60 parts of YAG:Ce phosphor (Intematix NYAG-4454-L) were mixed with 40 parts of a resin-linear silicone (e.g., of U.S. Pat. No. 8,921,495 B2) with aid of toluene to form a slurry. The slurry was applied to support layer (1) by blade coating technique, and the resulting applied coating was dried to prepare a laminate comprising a 100 μm thick dried film coupled to the support layer (1). The dried film was removed from support layer (1) to give preformed lamination layer (1) comprising 40 wt % of a resin-linear silicone and 60 wt % of a YAG:Ce phosphor admixed therein.

Preparation 2: preparation of preformed lamination layer (2). A phosphor blend was formed by mixing 3 parts of YAG:Ce phosphor (Intematix NYAG-4454-L) with 1 part of Europium doped nitride phosphor (Intermatix ER-6535) to give the phosphor blend. 60 parts of the phosphor blend were mixed with 40 parts of a resin-linear silicone (e.g., of U.S. Pat. No. 8,921,495 B2) with aid of toluene to form a slurry. The slurry was applied to support layer (1) by blade coating technique, and the resulting applied coating was dried to prepare a laminate comprising a 100 μm thick dried film coupled to the support layer (1). The dried film was removed from support layer (1) to give a 100 μm thick preformed lamination layer (2) comprising 40 wt % of a resin-linear silicone and 60 wt % of a phosphor blend admixed therein, wherein the phosphor blend is YAG:Ce (3 parts) and Eu doped nitride (1 part).

Preparation 3: preparation of preformed lamination layer (3). Replicate the procedure of Preparation 1 except use 80 parts of YAG:Ce phosphor (Intematix NYAG-4454-L) instead of the 60 parts of YAG:Ce phosphor (Intematix NYAG-4454-L) and use 20 parts of the resin-linear silicone instead of the 40 parts of a resin-linear silicone to give a 100 μm thick preformed lamination layer (3) comprising 20 wt % of a resin-linear silicone and 80 wt % of a YAG:Ce phosphor admixed therein.

Preparation 4: preparation of preformed lamination layer (4). Replicate the procedure of Preparation 3 except form a 55 μm thick preformed lamination layer (4) comprising 20 wt % of a resin-linear silicone and 80 wt % of a YAG:Ce phosphor admixed therein.

Comparative (non-invention) examples are included here for comparison purposes.

Comparative Example 1. attempted preparation of conformally coated LED array (3) using vacuum laminator (1): Replicate the procedure of Example 3 (140° C.) described below except omit the use of the carrier tray and instead place the assembly directly on the hot plate and drape support layer (2) over the assembly to avoid direct contact between the bladder and the preformed lamination layer (3). The lamination yield was 0%.

Comparative Example 2a. attempted preparation of conformally coated LED array (4) using vacuum laminator (1): Replicate the procedure of Example 4a (140° C.) described below except omit the perimeter jig and instead use the bladder of the vacuum laminator (1) to push the loaded carrier tray down on the hot plate. Total process time of 1 minute 30 seconds=evacuation time 60 seconds, 15 seconds of initial heating time (after contact with hot plate but before vacuum release), and 15 seconds of additional heating time (after vacuum release). The lamination yield was 0%.

Comparative Example 2b: attempted preparation of conformally coated LED array (4) using vacuum laminator (1): Replicate the procedure of Comparative Example 2a except use 150° C. set point temperature instead of 140° C.; 30 seconds evacuation time instead of 1 minute; 30 seconds of initial heating time (after contact with hot plate but before vacuum release), and 30 seconds additional heating time (after vacuum release) instead of 15 seconds to give conformally coated LED array (4b). Total process time of 1 minute 30 seconds=evacuation time 30 seconds and total heating time of 2×30 seconds. The lamination yield was 0%.

Non-limiting examples of embodiments of this invention follow. Any comparative examples should not be interpreted as being prior art.

Examples 1a to 1e: preparations of conformally coated LED arrays (1a) to (1e) using vacuum laminator (1). In each of five different experiments, each of n runs, an LED array (1) was conformally coated with a preformed lamination layer (1) using vacuum laminator (1) as follows. The hot plate in vacuum laminator (1) was activated such that the temperature of the hot plate was allowed to reach a set point (see Table 1 below). Separately, on LED array (1) was placed preformed lamination layer (1) to give an assembly, and the assembly was placed in a carrier tray. After the temperature of the hot plate reached its set point, the loaded carrier tray was placed on the springs in vacuum laminator (1) such that the bottom of the carrier tray was about 0.3 cm above the activated hot plate. The resulting loaded vacuum laminator (1) was closed, and a vacuum applied for 1 minute to evacuate the vacuum chamber and create an applied vacuum therein, all while the springs held the loaded carrier tray above the hot plate, thereby minimizing heating of the submount wafer of LED array (1), and in turn preformed lamination layer (1). Then, without contacting preformed lamination layer (1), the bladder of vacuum laminator (1) was lowered to push the loaded carrier tray onto the hot plate, where it remained under vacuum for an initial heating time of 1 minute and 30 seconds. This allowed the hot plate to heat the submount wafer, which in turn heated preformed lamination layer (1). The applied vacuum was then released completely by venting the vacuum chamber to ambient air, and the preformed lamination layer (1) was allowed to heat for an additional heating time of 2 minutes at ambient pressure to give a different one of conformally coated LED arrays (1a) to (1e), respectively, which were then removed from the vacuum chamber. Total process time of 4.5 minutes=evacuation time 1 minute and total heating time of 3.5 minutes. Replicate the run for Example 1e two more times. Table 1 below shows the lamination yield at various hot plate temperature set points ranging from 110° to 150° C.

TABLE 1 conformally coated LED arrays (1a) to (1e) prepared using vacuum laminator (1).

| Example: | 1a | 1b | 1c | 1d | 1e |
|---|---|---|---|---|---|
| Number of runs (n) | 1 | 1 | 1 | 1 | 3* |
| Set point Temp. (° C.) | 110 | 120 | 130 | 140 | 150 |
| Lamination Yield | 100% | 100% | 100% | 100% | 92% |

*83%, 95%, 98%

Examples 1f to 1j: preparations of conformally coated LED arrays (1f) to (1j) using vacuum laminator (2). Replicate Examples 1a to 1e except use vacuum laminator (2) instead of vacuum laminator (1) and place the loaded carrier tray directly on the hot plate instead of on the support springs of vacuum laminator (1) to give a different one of conformally coated LED arrays (1f) to (1j), respectively, which were then removed from the vacuum chamber. Replicate the runs for Examples 1i and 1j one more time. Table 2 below shows the lamination yield at various hot plate temperature set points ranging from 110° to 150° C.

TABLE 2 conformally coated LED arrays (1a) to (1e) prepared using vacuum laminator (2).

| Example: | 1f | 1g | 1h | 1i | 1j |
|---|---|---|---|---|---|
| Number of runs (n) | 1 | 1 | 1 | 2* | 2** |
| Set point Temp. (° C.) | 110 | 120 | 130 | 140 | 150 |
| Lamination Yield | 0% | 99% | 100% | 96% | 89% |

*93%, 99%;
**79%, 100%

Comparing the lamination yields in Tables 1 and 2 shows that the air between the preformed lamination layer (1) and the LED arrays (1a) to (1j) in the assemblies may be evacuated using either vacuum laminator (1) or (2) prior to the heat-softening of the preformed lamination layer (1), but the corresponding process window is wider when using vacuum laminator (1) than is the process window when using vacuum laminator (2), which lacks the support springs. In some embodiments the inventive method holds the assembly spaced apart from the activated heater during the applying a vacuum step.

Examples 2a to 2e: preparations of conformally coated LED arrays (2a) to (2e) using vacuum laminator (1): Replicate the procedure of Examples 1a to 1e except use preformed lamination layer (2) instead of preformed lamination layer (1) to give conformally coated LED arrays (2a) to (2e). Table 3 below shows the lamination yield at various hot plate temperature set points ranging from 110° to 150° C.

TABLE 3 conformally coated LED arrays (2a) to (2e) prepared using vacuum laminator (1).

| Example: | 2a | 2b | 2c | 2d | 2e |
|---|---|---|---|---|---|
| Number of runs (n) | 1 | 1 | 1 | 1 | 1 |
| Set point Temp. (° C.) | 110 | 120 | 130 | 140 | 150 |
| Lamination Yield | 13% | 99% | 100% | 93% | 81% |

As shown by the lamination yield data in Table 3, specifically for Example 2a relative to Examples 2b to 2e, if the hot plate set point temperature is too low, preformed lamination layer (2) does not soften sufficiently after only the 1 minute and 30 seconds and additional 2 minutes of heating time. Thus, the heating time may be increased if a set point temperature is otherwise too low in order to give the preformed lamination layer time to form the conformally coated article. The conditions in Example 2a may be improved so as to produce a conformal coating at a set point temperature of 110° C. In some embodiments Example 2a is excluded from this invention.

Examples 2f to 2j: preparations of conformally coated LED arrays (2f) to (2j) using vacuum laminator (2). Replicate Examples 1f to 1j except use preformed lamination layer (2) instead of preformed lamination layer (1) to give conformally coated LED arrays (2f) to (2j), respectively, which were then removed from the vacuum chamber. Table 4 below shows the lamination yield at various hot plate temperature set points ranging from 110° to 150° C.

TABLE 4 conformally coated LED arrays (1a) to (1e) prepared using vacuum laminator (2).

| Example: | 2f | 2g | 2h | 2i | 2j |
|---|---|---|---|---|---|
| Number of runs (n) | 1 | 1 | 1 | 2* | 2** |
| Set point Temp. (° C.) | 110 | 120 | 130 | 140 | 150 |
| Lamination Yield | 24% | 99% | 56% | 0% | 22% |

*0% was obtained in both runs;
**43% and 0%.

Comparing the lamination yields in Tables 3 and 4 shows that the air between the preformed lamination layer (2) and the LED arrays (2a) to (2j) in the assemblies may be evacuated using either vacuum laminator (1) or (2) prior to the heat-softening of the preformed lamination layer (2), but the corresponding process window is considerably wider when using vacuum laminator (1) than is the process window when using vacuum laminator (2), which lacks the support springs. Also, as shown by the lamination yield data in Table 4, if the hot plate set point temperature is too high, preformed lamination layer (2) may heat-soften too quickly relative to the rate of evacuation of the vacuum chamber. Thus, the rate of evacuation may be increased or the set point temperature may be decreased if a set point temperature is otherwise too high in order to give evacuation step time to remove air from between the preformed lamination layer (2) and LED arrays 2 in order to form the conformally coated article. The conditions in Example 2f and 2h to 2j may be improved so as to produce a conformal coating at a set point temperature of 110°, 130°, 140°, or 150° C. In some embodiments Examples 2f and 2h to 2j are excluded from this invention.

Example 3: preparation of conformally coated LED array (3) using vacuum laminator (1): Replicate the procedure of Example 1d (140° C.) except use preformed lamination layer (3) instead of preformed lamination layer (1) to give conformally coated LED array (3). The lamination yield was 100%. Compare with Comparative Example 1 described above.

Examples 4a: preparation of conformally coated LED array (4) using vacuum laminator (1): Replicate the procedure of Example 1d (140° C.) except use preformed lamination layer (4) instead of preformed lamination layer (1) and use a perimeter stamping jig configured to contact the entire edge portion of the second surface of the preformed lamination layer (4) and press same against the perimeter portion of the first side of the submount wafer while maintaining a gap between the edge portion of the first surface of the preformed lamination layer (4) and the perimeter portion of the first side of the submount wafer of LED array (1) so that the pressing does not tear the softened preformed lamination layer; use an initial heating time (after contact with hot plate but prior to vacuum release) of 15 seconds instead of 1 minute and 30 seconds; and use an additional heating time (after vacuum release) of 15 seconds instead of 2 minutes to give conformally coated LED array (4a). Total process time of 1.5 minutes=evacuation time 1 minute and total heating time of 30 seconds. The stamping jig is used to press or impinge the edge portion of the preformed lamination layer on to the perimeter portion of the submount wafer, thereby forcing gastight sealing around the perimeter. The lamination yield was 100%. Compare with Comparative Example 2 described above.

Example 4b: Replicate the procedure of Example 4a except use 150° C. set point temperature instead of 140° C.; 30 seconds evacuation time instead of 1 minute; and 30 seconds additional heating time (after vacuum release) instead of 15 seconds to give conformally coated LED array (4b). Total process time of 1 minute 15 seconds=evacuation time 30 seconds and total heating time of 45 seconds. The lamination yield was 98%.

The perimeter jig facilitates sealing of the heat-softened edge portion of the preformed lamination layer to the perimeter portion of the first surface of the object.

Examples 5a to 5e (prophetic): preparations of conformally coated LED arrays (5a) to (5e) using vacuum laminator (1). In each of five different experiments, each of 1 run, an LED array (1) is conformally coated with a preformed lamination layer (5) using vacuum laminator (1) as follows. The hot plate in vacuum laminator (1) is activated such that the temperature of the hot plate is allowed to reach a set point of 110°, 120°, 130°, 140° or 150° C., respectively. Separately, on LED array (1) is placed preformed lamination layer (5) to give an assembly, and the assembly is placed in a carrier tray. After the temperature of the hot plate reaches its set point, the loaded carrier tray is placed on the springs in vacuum laminator (1) such that the bottom of the carrier tray is about 0.3 cm above the activated hot plate. The resulting loaded vacuum laminator (1) is closed, and a vacuum is applied for 1 minute to evacuate the vacuum chamber and create an applied vacuum therein, all while the springs hold the loaded carrier tray above the hot plate, thereby minimizing heating of the submount wafer of LED array (1), and in turn preformed lamination layer (5). Then, without contacting preformed lamination layer (5), the bladder of vacuum laminator (1) is lowered to push the loaded carrier tray onto the hot plate, where it remains under vacuum for an initial heating time of 1 minute and 30 seconds. This allows the hot plate to heat the submount wafer, which in turn heats preformed lamination layer (5). The applied vacuum is then released completely by venting the vacuum chamber to ambient air, and the preformed lamination layer (5) is allowed to heat for an additional heating time of 2 minutes at ambient pressure to give a different one of conformally coated LED arrays (5a) to (5e), respectively, which are then removed from the vacuum chamber. Total process time of 4.5 minutes=evacuation time 1 minute and total heating time of 3.5 minutes. Determine the lamination yield of conformally coated LED arrays (5a) to (5e).

Examples 6a to 6e (prophetic): Replicate Examples 5a to 5e except use preformed lamination layer (6) instead of preformed lamination layer (5) to give conformally coated LED arrays (6a) to (6e). Determine the lamination yield of conformally coated LED arrays (6a) to (6e).

Examples 7a to 7e (prophetic): Replicate Examples 5a to 5e except use Object (2) instead of LED array (1) (Object (1)) to give conformally coated glass sheets (7a) to (7e), respectively. Visually inspect sheets (7a) to (7e) for trapped microscopic air bubbles. If air bubbles are trapped, repeat the procedure of Examples 7a to 7e except use preformed lamination layer (7) instead of preformed lamination layer (5). Alternatively, if air bubbles are trapped, repeat the procedure of Examples 7a to 7e except finish evacuating the vacuum laminator (1) before beginning to heat the Object (2), so as to give air bubble free form of conformally coated silica glass sheets (7a) to (7e).

Certain embodiments of this invention are hereupon claimed. The claims that follow are incorporated here by reference as numbered embodiments.

The invention claimed is:

1. A method of fabricating a conformally coated article from an assembly that is housed in a vacuum chamber of a fabrication device;

wherein the vacuum chamber contains an applied vacuum;

wherein the assembly comprises a preformed lamination layer and an object having a surface for lamination;

wherein the preformed lamination layer has a first surface and a second surface opposite the first surface, and a heat-softened middle portion at a first temperature and surrounded by an edge portion;

wherein the object has a first surface and a second surface opposite the first surface, and the first surface being in need of lamination and comprising an inner portion and a perimeter portion surrounding the inner portion;

wherein the assembly is configured such that the first surface of the preformed lamination layer is positioned facing the first surface of the object, wherein the edge portion of the preformed lamination layer forms a gastight seal to the perimeter portion of the first surface of the object such that the assembly contains a gastight inner region defined by a combination of the gastight seal, the first surface of the preformed lamination layer and the first surface of the object, wherein the heat-softened middle portion of the preformed lamination layer is spaced apart from the inner portion of the first surface of the object by the gastight inner region, and wherein the gastight inner region contains a reduced gas pressure;

wherein the applied vacuum in the vacuum chamber is effectively equal to the reduced gas pressure in the gastight inner region of the assembly; and said method comprising:

conforming the heat-softened middle portion of the preformed lamination layer to the inner portion of the first surface of the object by increasing gas pressure within the vacuum chamber such that the gas pressure within the vacuum chamber is greater than the reduced gas pressure within the gastight inner region, thereby conformally pushing the heat-softened middle portion against the inner portion of the first surface of the object so as to fabricate the conformally coated article;

wherein the conformally coated article comprises a conformed lamination layer and the object, wherein the conformed lamination layer is formed from the preformed lamination layer and has a first surface and a second surface opposite the first surface, and a middle portion and an edge portion surrounding the middle portion; wherein the object has a first surface having an inner portion and a perimeter portion surrounding the inner portion, wherein the inner portion of the first surface of the object is conformally coated by the middle portion of the conformed lamination layer; and wherein the edge portion of the conformed lamination layer forms a gastight seal to the perimeter portion of the first surface of the object, wherein the middle portion of the preformed lamination layer is heated in only one heating step.

2. The method of claim 1 wherein in the conforming step the gas pressure is increased within the vacuum chamber by breaking the applied vacuum in the vacuum chamber of the fabrication device and allowing a gas to enter the vacuum chamber.

3. The method of claim 2 further comprising, prior to the sealing step, heating, under the applied vacuum, the edge portion of the preformed lamination layer to the second temperature to form the heat-softened edge portion of the preformed lamination layer.

4. The method of claim 3 further comprising, prior to the heating step, applying a vacuum within the vacuum chamber to remove gas from the vacuum chamber, including from between the first surface of the preformed lamination layer and the first surface of the object, so as to create the applied vacuum in the vacuum chamber of the fabrication device.

5. The method of claim 4 further comprising, prior to the applying step, introducing the preformed lamination layer and the object into the vacuum chamber of the fabrication device; and prior to, during or after the introducing step, mounting the preformed lamination layer against the object such that the first surface of the preformed lamination layer is positioned facing the first surface of the object; wherein the preformed lamination layer used in the mounting step is coupled to a support layer and wherein the method further comprises, after the mounting step and prior to the introducing step: Adhering a first subportion of the edge portion of the preformed lamination layer to a first subportion of the perimeter portion of the first surface of the object without adhering a second subportion of the edge portion of the preformed lamination layer to a second subportion of the perimeter portion of the first surface of the object, wherein the adhering step is performed while the preformed lamination layer is coupled to the support layer; and Removing, after the adhering step, the support layer from the mounted preformed lamination layer.

6. The method of claim 1 or 2 further comprising, prior to the conforming step, sealing, under the applied vacuum, the edge portion of the preformed lamination layer to the perimeter portion of the first surface of the object by contacting the edge portion of the preformed lamination layer to the perimeter portion of the first surface of the object so as to form the gastight seal and the gastight inner region of the assembly, wherein during the contacting the edge portion of the preformed lamination layer is characterized by being heat-softened at a second temperature, wherein the first and second temperatures are the same or different.

7. The method of claim 6 wherein the sealing step comprises pressing the heat-softened edge portion of the preformed lamination layer to the perimeter portion of the first surface of the object.

8. The method of claim 6 further comprising, prior to the sealing step, the actions of:

heating a portion of the edge portion to the second temperature to soften the portion of the edge portion of the preformed lamination layer while maintaining the middle portion of the preformed lamination layer and another portion of the edge portion at a temperature below the first temperature; and pressing the softened portion of the edge portion to the perimeter portion until adhesion is obtained between the first surface of the softened edge portion of the preformed lamination layer and the perimeter portion; and wherein adhesion is not obtained between the another portion of the edge portion such that the gastight inner region is not created.

9. The method of claim 6, wherein the preformed lamination layer is not adhered to a support layer during or subsequent to the sealing step or any adhering step.

10. The method of claim 1 further comprising, prior to the conforming step, heating, under the applied vacuum, the middle portion of the preformed lamination layer to the first temperature to soften the middle portion of the preformed lamination layer to form the heat-softened middle portion of the preformed lamination layer.

11. The method of claim 10 wherein the fabrication device further includes a first heater device, which is positioned adjacent to the second surface of the object in such a way that any thermal communication between the first heater and the second surface of the object is insufficient to soften the preformed lamination layer; and wherein the heating step comprises:

moving the second surface of the object into thermal communication with the first heater device, or vice versa; and activating the first heater device so that it produces heat; wherein the activated first heater device heats the object, which consequently heats the preformed lamination layer to the first temperature to independently soften the edge portion and the middle portion of the preformed lamination layer.

12. The method of claim 11 wherein the activating step is performed after the moving step.

13. The method according to claim 11 wherein the vacuum chamber includes an external frame having at least one displaceable structure that is movable from an engaged position to a disengaged position, and wherein the assembly is disposed on the at least one displaceable structure to give a loaded displaceable structure, wherein the loaded displaceable structure is disposed in the engaged position; wherein the heating step comprises moving the loaded displaceable structure from the engaged position to the disengaged position to move the second surface of the object into thermal communication with the first heater device.

14. The method of claim 1 wherein the object further comprises at least one additional feature in need of lamination, wherein the at least one additional feature is disposed in operative contact with the inner portion of the first surface of the object and within the gastight inner region of the assembly and wherein the at least one additional feature is conformally coated in the conforming step and by the conformed lamination layer in the conformally coated article.

15. The method of claim 14 wherein the object comprises a plurality of light emitting diodes (LEDs) and a submount wafer, wherein the submount wafer has a first surface and a second surface opposite the first surface and the first surface of the submount wafer has an inner portion and a perimeter portion surrounding the inner portion; wherein the LEDs are arrayed on the inner portion of the first surface of the submount wafer and wherein the LEDs and the inner portion of the first surface of the submount wafer together are in need of lamination.

16. The method according to claim 15, wherein the preformed lamination layer comprises a phosphor material disposed in a silicone binder or in a substantially uncured thermosetting material.

17. The method of claim 1, further comprising removing the conformally coated article from the fabrication device.

18. The method of claim 1 comprising a method for fabricating a light emitting diode device in a fabrication device having a vacuum chamber, the method comprising:
(A) mounting a preformed lamination layer having a first surface and a second surface over a light emitting diode (LED) array, said LED array comprising an array of light emitting diodes disposed on an inner portion of a first side of a submount wafer, said submount wafer further including a perimeter portion surrounding said inner portion and a second side opposite said first side; wherein said first surface of said preformed lamination layer is located between said first side of said submount wafer and said second surface of said preformed lamination layer, said preformed lamination layer having a middle portion surrounded by an edge portion;
(B) adhering a portion of said edge portion of said preformed lamination layer to said perimeter portion of said first side of said submount wafer;
(C) introducing said LED array and said preformed lamination layer to the vacuum chamber;
(D) after step (C), applying a vacuum within the vacuum chamber and heating said preformed lamination layer to a first temperature sufficient to soften said edge portion and said middle portion of said preformed lamination layer;
(E) sealing said softened edge portion to said perimeter portion under said applied vacuum to create an gastight seal there between, thereby creating an gastight inner region defined by said gastight seal, said first surface of said preformed lamination layer and said first side of said submount wafer; and
(F) after step (E), conforming said softened preformed lamination layer over said LED array by increasing the gas pressure within the vacuum chamber in an area not defined by said gastight inner region to a pressure greater than the gas pressure within said gastight inner region.

19. The conformally coated article prepared by the method of claim 1.

20. The method of claim 1, wherein the preformed lamination layer comprises a substantially uncured thermosetting material.

* * * * *